United States Patent
Shamma et al.

(10) Patent No.: US 12,315,727 B2
(45) Date of Patent: May 27, 2025

(54) ELIMINATING YIELD IMPACT OF STOCHASTICS IN LITHOGRAPHY

(71) Applicant: Lam Research Corporation, Fremont, CA (US)

(72) Inventors: Nader Shamma, Cupertino, CA (US); Richard Wise, Los Gatos, CA (US); Jengyi Yu, San Ramon, CA (US); Samantha S.H. Tan, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 571 days.

(21) Appl. No.: 17/645,939

(22) Filed: Dec. 23, 2021

(65) Prior Publication Data

US 2022/0122846 A1    Apr. 21, 2022

Related U.S. Application Data

(62) Division of application No. 17/008,095, filed on Aug. 31, 2020, now Pat. No. 11,257,674, which is a
(Continued)

(51) Int. Cl.
*H01L 21/67* (2006.01)
*H01L 21/033* (2006.01)
(Continued)

(52) U.S. Cl.
CPC ...... *H01L 21/0338* (2013.01); *H01L 21/0332* (2013.01); *H01L 21/0335* (2013.01);
(Continued)

(58) Field of Classification Search
CPC ............. H01L 21/0338; H01L 21/0332; H01L 21/0337; H01L 21/0335; H01L 21/02115;
(Continued)

(56) References Cited

U.S. PATENT DOCUMENTS

| | | | |
|---|---|---|---|
| 3,442,648 | A | 5/1969 | Smith et al. |
| 3,513,010 | A | 5/1970 | Notley et al. |

(Continued)

FOREIGN PATENT DOCUMENTS

| | | |
|---|---|---|
| CN | 1904727 A | 1/2007 |
| CN | 101631894 A | 1/2010 |

(Continued)

OTHER PUBLICATIONS

Chinese First Office Action dated Aug. 28, 2019 issued in Application No. CN 201710066218.0.
(Continued)

*Primary Examiner* — S M Sohel Imtiaz
(74) *Attorney, Agent, or Firm* — Weaver Austin Villeneuve & Sampson LLP

(57) ABSTRACT

Methods and apparatuses for performing cycles of aspect ratio dependent deposition and aspect ratio independent etching on lithographically patterned substrates are described herein. Methods are suitable for reducing variation of feature depths and/or aspect ratios between features formed and partially formed by lithography, some partially formed features being partially formed due to stochastic effects. Methods and apparatuses are suitable for processing a substrate having a photoresist after extreme ultraviolet lithography. Some methods involve cycles of deposition by plasma enhanced chemical vapor deposition and directional etching by atomic layer etching.

13 Claims, 13 Drawing Sheets

Related U.S. Application Data division of application No. 15/979,340, filed on May 14, 2018, now Pat. No. 10,796,912.

(60) Provisional application No. 62/506,803, filed on May 16, 2017.

(51) Int. Cl.
   *H01L 21/677* (2006.01)
   *H01L 21/02* (2006.01)
   *H01L 21/311* (2006.01)

(52) U.S. Cl.
   CPC .... H01L 21/0337 (2013.01); H01L 21/67703 (2013.01); *H01L 21/02115* (2013.01); *H01L 21/02274* (2013.01); *H01L 21/31122* (2013.01); *H01L 21/31138* (2013.01)

(58) Field of Classification Search
   CPC ......... H01L 21/31138; H01L 21/31122; H01L 21/02274; H01L 21/67703
   See application file for complete search history.

(56) References Cited

U.S. PATENT DOCUMENTS

| | | | |
|---|---|---|---|
| 3,529,963 | A | 9/1970 | Marchese et al. |
| 3,576,755 | A | 4/1971 | Patella et al. |
| 3,720,515 | A | 3/1973 | Stanley |
| 4,241,165 | A | 12/1980 | Hughes et al. |
| 4,328,298 | A | 5/1982 | Nester |
| 4,341,592 | A | 7/1982 | Shortes et al. |
| 4,590,149 | A | 5/1986 | Nakane et al. |
| 4,738,748 | A | 4/1988 | Kisa |
| 4,756,794 | A | 7/1988 | Yoder |
| 4,806,456 | A | 2/1989 | Katoh |
| 4,834,834 | A | 5/1989 | Ehrlich et al. |
| 4,842,989 | A | 6/1989 | Taniguchi et al. |
| 4,845,053 | A | 7/1989 | Zajac |
| 4,940,854 | A | 7/1990 | Debe |
| 5,077,085 | A | 12/1991 | Schnur et al. |
| 5,322,765 | A | 6/1994 | Clecak et al. |
| 5,445,988 | A | 8/1995 | Schwalke |
| 5,534,312 | A | 7/1996 | Hill et al. |
| 5,914,278 | A | 6/1999 | Boitnott et al. |
| 5,925,494 | A | 7/1999 | Horn |
| 6,017,553 | A | 1/2000 | Burrell et al. |
| 6,045,877 | A | 4/2000 | Gleason et al. |
| 6,162,577 | A | 12/2000 | Felter et al. |
| 6,179,922 | B1 | 1/2001 | Ishikawa et al. |
| 6,261,938 | B1 | 7/2001 | Beauvais et al. |
| 6,290,779 | B1 | 9/2001 | Saleh et al. |
| 6,348,239 | B1 | 2/2002 | Hill et al. |
| 6,448,097 | B1 | 9/2002 | Singh et al. |
| 6,562,700 | B1 | 5/2003 | Gu et al. |
| 6,573,030 | B1 | 6/2003 | Fairbairn et al. |
| 6,607,867 | B1 | 8/2003 | Kim et al. |
| 6,797,439 | B1 | 9/2004 | Alpay |
| 6,841,341 | B2 | 1/2005 | Fairbairn et al. |
| 6,841,943 | B2 | 1/2005 | Vahedi et al. |
| 7,169,440 | B2 | 1/2007 | Balasubramaniam et al. |
| 7,223,526 | B2 | 5/2007 | Fairbairn et al. |
| 7,307,695 | B2 | 12/2007 | Hazenberg et al. |
| 7,335,462 | B2 | 2/2008 | Fairbairn et al. |
| 7,416,989 | B1 | 8/2008 | Liu et al. |
| 7,608,367 | B1 | 10/2009 | Aigeldinger et al. |
| 7,759,239 | B1 | 7/2010 | Lin et al. |
| 8,465,903 | B2 | 6/2013 | Weidman et al. |
| 8,536,068 | B2 | 9/2013 | Weidman et al. |
| 8,552,334 | B2 | 10/2013 | Tappan et al. |
| 8,664,124 | B2 | 3/2014 | Graff |
| 8,664,513 | B2 | 3/2014 | Pfenninger et al. |
| 8,703,386 | B2 | 4/2014 | Bass et al. |
| 8,808,561 | B2 | 8/2014 | Kanarik |
| 8,883,028 | B2 | 11/2014 | Kanarik |
| 8,883,405 | B2 | 11/2014 | Shiobara |
| 8,993,352 | B2 | 3/2015 | Nishimura et al. |
| 9,023,731 | B2 | 5/2015 | Ji et al. |
| 9,261,784 | B2 | 2/2016 | Wuister et al. |
| 9,310,684 | B2 | 4/2016 | Meyers et al. |
| 9,551,924 | B2 | 1/2017 | Burkhardt et al. |
| 9,576,811 | B2 | 2/2017 | Kanarik et al. |
| 9,632,411 | B2 | 4/2017 | Michaelson et al. |
| 9,647,206 | B2 | 5/2017 | Hashimoto et al. |
| 9,778,561 | B2 | 10/2017 | Marks et al. |
| 9,806,252 | B2 | 10/2017 | Tan et al. |
| 9,823,564 | B2 | 11/2017 | Stowers et al. |
| 9,991,128 | B2 | 6/2018 | Tan et al. |
| 9,996,004 | B2 | 6/2018 | Smith et al. |
| 9,997,371 | B1 | 6/2018 | Agarwal et al. |
| 10,025,179 | B2 | 7/2018 | Meyers et al. |
| 10,228,618 | B2 | 3/2019 | Meyers et al. |
| 10,269,566 | B2 | 4/2019 | Tan et al. |
| 10,297,440 | B2 | 5/2019 | Yamazaki et al. |
| 10,416,554 | B2 | 9/2019 | Meyers et al. |
| 10,494,715 | B2 | 12/2019 | Agarwal et al. |
| 10,514,598 | B2 | 12/2019 | Marks et al. |
| 10,566,212 | B2 | 2/2020 | Kanarik |
| 10,566,213 | B2 | 2/2020 | Kanarik et al. |
| 10,580,585 | B2 | 3/2020 | Snaith et al. |
| 10,627,719 | B2 | 4/2020 | Waller et al. |
| 10,642,153 | B2 | 5/2020 | Meyers et al. |
| 10,649,328 | B2 | 5/2020 | Stowers et al. |
| 10,685,836 | B2 | 6/2020 | Tan et al. |
| 10,732,505 | B1 | 8/2020 | Meyers et al. |
| 10,775,696 | B2 | 9/2020 | Meyers et al. |
| 10,782,610 | B2 | 9/2020 | Stowers et al. |
| 10,787,466 | B2 | 9/2020 | Edson et al. |
| 10,796,912 | B2 | 10/2020 | Shamma et al. |
| 10,831,096 | B2 | 11/2020 | Marks et al. |
| 10,832,909 | B2 | 11/2020 | Lavoie et al. |
| 11,209,729 | B2 | 12/2021 | Marks et al. |
| 11,239,094 | B2 | 2/2022 | Kanarik |
| 11,257,674 | B2 | 2/2022 | Shamma et al. |
| 11,314,168 | B2 | 4/2022 | Tan et al. |
| 11,705,332 | B2 | 7/2023 | Kuo et al. |
| 11,721,558 | B2 | 8/2023 | Kanarik |
| 12,062,538 | B2 | 8/2024 | Yu et al. |
| 12,125,711 | B2 | 10/2024 | Zhou et al. |
| 2001/0024769 | A1* | 9/2001 | Donoghue ........ H01L 21/31138 430/329 |
| 2002/0017243 | A1 | 2/2002 | Pyo |
| 2002/0051728 | A1 | 5/2002 | Sato et al. |
| 2002/0180372 | A1 | 12/2002 | Yamazaki |
| 2003/0008246 | A1 | 1/2003 | Cheng et al. |
| 2003/0183244 | A1 | 10/2003 | Rossman |
| 2004/0113087 | A1 | 6/2004 | Ikeda et al. |
| 2004/0175631 | A1 | 9/2004 | Crocker et al. |
| 2004/0191423 | A1 | 9/2004 | Ruan et al. |
| 2004/0213563 | A1 | 10/2004 | Irie |
| 2005/0061234 | A1 | 3/2005 | Li et al. |
| 2005/0167617 | A1 | 8/2005 | Derra et al. |
| 2005/0208389 | A1 | 9/2005 | Ishibashi et al. |
| 2005/0208754 | A1 | 9/2005 | Kostamo et al. |
| 2005/0241933 | A1 | 11/2005 | Branton et al. |
| 2005/0253077 | A1 | 11/2005 | Ikeda et al. |
| 2006/0001064 | A1 | 1/2006 | Hill et al. |
| 2006/0068173 | A1 | 3/2006 | Kajiyama et al. |
| 2006/0147818 | A1 | 7/2006 | Lee |
| 2006/0151462 | A1 | 7/2006 | Lee et al. |
| 2006/0166537 | A1 | 7/2006 | Thompson et al. |
| 2006/0172530 | A1 | 8/2006 | Cheng et al. |
| 2006/0175558 | A1 | 8/2006 | Bakker et al. |
| 2006/0287207 | A1 | 12/2006 | Park et al. |
| 2007/0017386 | A1 | 1/2007 | Kamei |
| 2007/0037410 | A1 | 2/2007 | Chang et al. |
| 2007/0069162 | A1 | 3/2007 | Banine et al. |
| 2007/0074541 | A1 | 4/2007 | Badding et al. |
| 2007/0082508 | A1 | 4/2007 | Chiang et al. |
| 2007/0095367 | A1 | 5/2007 | Wang et al. |
| 2007/0117040 | A1 | 5/2007 | Brock et al. |
| 2007/0181816 | A1 | 8/2007 | Ikeda et al. |
| 2007/0212889 | A1 | 9/2007 | Abatchev et al. |
| 2007/0287073 | A1 | 12/2007 | Goodwin |

(56) References Cited

U.S. PATENT DOCUMENTS

| | | |
|---|---|---|
| 2008/0070128 A1 | 3/2008 | Wu et al. |
| 2008/0157011 A1 | 7/2008 | Nagai et al. |
| 2009/0075472 A1 | 3/2009 | Arnold et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0286402 A1* | 11/2009 | Xia ................... H01L 21/3141 438/703 |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0022078 A1 | 1/2010 | Rockenberger et al. |
| 2010/0060539 A1 | 3/2010 | Suetsuna et al. |
| 2010/0131093 A1 | 5/2010 | Yokoyama et al. |
| 2010/0197135 A1 | 8/2010 | Ishizaka |
| 2010/0266969 A1 | 10/2010 | Shiraishi et al. |
| 2010/0297847 A1* | 11/2010 | Cheng .............. H01L 21/31144 438/694 |
| 2010/0304027 A1 | 12/2010 | Lee et al. |
| 2010/0310790 A1 | 12/2010 | Chang et al. |
| 2011/0059617 A1 | 3/2011 | Mitchell et al. |
| 2011/0104595 A1 | 5/2011 | Hayashi et al. |
| 2011/0117678 A1 | 5/2011 | Varadarajan et al. |
| 2011/0117702 A1 | 5/2011 | Rietzler et al. |
| 2011/0130011 A1 | 6/2011 | Sasajima et al. |
| 2011/0139748 A1 | 6/2011 | Donnelly et al. |
| 2011/0192820 A1 | 8/2011 | Yeom et al. |
| 2011/0198756 A1 | 8/2011 | Thenappan et al. |
| 2011/0209725 A1 | 9/2011 | Kim et al. |
| 2012/0068347 A1 | 3/2012 | Isobayashi et al. |
| 2012/0077349 A1 | 3/2012 | Li et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0100308 A1 | 4/2012 | Milligan et al. |
| 2012/0126358 A1 | 5/2012 | Arnold et al. |
| 2012/0193762 A1 | 8/2012 | Lin et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1 | 12/2012 | Wu et al. |
| 2013/0023124 A1* | 1/2013 | Nemani ............ H01L 21/31116 438/703 |
| 2013/0109186 A1 | 5/2013 | Zhang et al. |
| 2013/0115763 A1 | 5/2013 | Takamure et al. |
| 2013/0129995 A1 | 5/2013 | Ouattara et al. |
| 2013/0157177 A1 | 6/2013 | Yu et al. |
| 2013/0168354 A1 | 7/2013 | Kanarik |
| 2013/0177847 A1 | 7/2013 | Chatterjee et al. |
| 2013/0224652 A1 | 8/2013 | Bass et al. |
| 2013/0330928 A1 | 12/2013 | Ishikawa et al. |
| 2013/0330932 A1 | 12/2013 | Rangarajan et al. |
| 2014/0014745 A1 | 1/2014 | Burrows et al. |
| 2014/0120688 A1* | 5/2014 | Booth, Jr. ............ H01L 27/1203 438/386 |
| 2014/0134827 A1 | 5/2014 | Swaminathan et al. |
| 2014/0134847 A1 | 5/2014 | Seya |
| 2014/0170563 A1 | 6/2014 | Hatakeyama |
| 2014/0175617 A1 | 6/2014 | Antonelli et al. |
| 2014/0178568 A1 | 6/2014 | Wolff et al. |
| 2014/0193580 A1* | 7/2014 | Tiron ....................... B05D 5/00 427/258 |
| 2014/0209015 A1 | 7/2014 | Yamada et al. |
| 2014/0220489 A1 | 8/2014 | Kozuma et al. |
| 2014/0239462 A1* | 8/2014 | Shamma ............ H01L 21/0276 257/637 |
| 2014/0268082 A1 | 9/2014 | Michaelson et al. |
| 2014/0272726 A1 | 9/2014 | Chang |
| 2015/0017812 A1 | 1/2015 | Chandrasekharan et al. |
| 2015/0037972 A1 | 2/2015 | Danek et al. |
| 2015/0041809 A1 | 2/2015 | Arnold et al. |
| 2015/0056542 A1 | 2/2015 | Meyers et al. |
| 2015/0064917 A1 | 3/2015 | Somervell et al. |
| 2015/0077733 A1 | 3/2015 | Huang et al. |
| 2015/0079393 A1 | 3/2015 | Freedman et al. |
| 2015/0084156 A1 | 3/2015 | Ravasio et al. |
| 2015/0125679 A1 | 5/2015 | Ishikawa |
| 2015/0132965 A1 | 5/2015 | Devilliers et al. |
| 2015/0152551 A1 | 6/2015 | Yamaguchi et al. |
| 2015/0162168 A1 | 6/2015 | Oehrlein et al. |
| 2015/0170957 A1* | 6/2015 | Tsao ....................... H01L 31/04 257/510 |
| 2015/0194343 A1 | 7/2015 | Chi et al. |
| 2015/0217330 A1 | 8/2015 | Haukka et al. |
| 2015/0221519 A1 | 8/2015 | Marks et al. |
| 2015/0243520 A1 | 8/2015 | Park et al. |
| 2015/0270140 A1 | 9/2015 | Gupta et al. |
| 2015/0303064 A1 | 10/2015 | Singer et al. |
| 2015/0332922 A1 | 11/2015 | Chien et al. |
| 2016/0011505 A1 | 1/2016 | Stowers et al. |
| 2016/0011516 A1 | 1/2016 | Devilliers |
| 2016/0013063 A1 | 1/2016 | Ranjan et al. |
| 2016/0035631 A1 | 2/2016 | Lee et al. |
| 2016/0064244 A1 | 3/2016 | Agarwal et al. |
| 2016/0086864 A1 | 3/2016 | Fischer et al. |
| 2016/0116839 A1 | 4/2016 | Meyers et al. |
| 2016/0118246 A1* | 4/2016 | Kang ................ H01L 21/76837 438/771 |
| 2016/0135274 A1* | 5/2016 | Fischer ............ H01L 21/67069 438/9 |
| 2016/0179005 A1 | 6/2016 | Shamma et al. |
| 2016/0203995 A1 | 7/2016 | Kanarik et al. |
| 2016/0216606 A1 | 7/2016 | Meyers et al. |
| 2016/0284559 A1 | 9/2016 | Kikuchi et al. |
| 2016/0293405 A1 | 10/2016 | Matsumoto et al. |
| 2016/0308112 A1 | 10/2016 | Tan et al. |
| 2016/0314964 A1 | 10/2016 | Tang et al. |
| 2016/0357107 A1 | 12/2016 | Buchberger, Jr. et al. |
| 2016/0358782 A1 | 12/2016 | Yang et al. |
| 2016/0365248 A1* | 12/2016 | Mebarki ........... H01L 21/31138 |
| 2016/0379824 A1 | 12/2016 | Wise et al. |
| 2017/0010535 A1 | 1/2017 | Fujitani et al. |
| 2017/0053808 A1 | 2/2017 | Kamp et al. |
| 2017/0069462 A1 | 3/2017 | Kanarik et al. |
| 2017/0102612 A1 | 4/2017 | Meyers et al. |
| 2017/0125256 A1 | 5/2017 | Lee et al. |
| 2017/0146909 A1 | 5/2017 | Smith et al. |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0178917 A1 | 6/2017 | Kamp et al. |
| 2017/0184961 A1 | 6/2017 | Nakagawa et al. |
| 2017/0192357 A1 | 7/2017 | Carcasi et al. |
| 2017/0229311 A1 | 8/2017 | Tan et al. |
| 2017/0261850 A1 | 9/2017 | Stowers et al. |
| 2017/0316935 A1 | 11/2017 | Tan et al. |
| 2018/0004083 A1 | 1/2018 | Marks et al. |
| 2018/0012759 A1 | 1/2018 | Smith et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0061663 A1 | 3/2018 | Chandrashekar et al. |
| 2018/0122648 A1 | 5/2018 | Kim et al. |
| 2018/0151350 A1 | 5/2018 | Li |
| 2018/0166278 A1 | 6/2018 | Belyansky et al. |
| 2018/0174860 A1 | 6/2018 | Kanarik |
| 2018/0224744 A1 | 8/2018 | Bae et al. |
| 2018/0233362 A1 | 8/2018 | Glodde et al. |
| 2018/0307137 A1 | 10/2018 | Meyers et al. |
| 2018/0308687 A1 | 10/2018 | Smith et al. |
| 2018/0308695 A1 | 10/2018 | LaVoie et al. |
| 2018/0312973 A1 | 11/2018 | Agarwal et al. |
| 2018/0314167 A1 | 11/2018 | Chang et al. |
| 2018/0337046 A1 | 11/2018 | Shamma et al. |
| 2018/0350624 A1 | 12/2018 | Kanarik et al. |
| 2018/0350879 A1 | 12/2018 | Sel et al. |
| 2018/0354804 A1 | 12/2018 | Venkatasubramania et al. |
| 2019/0027357 A1 | 1/2019 | Girard et al. |
| 2019/0043731 A1 | 2/2019 | Bristol et al. |
| 2019/0094175 A1 | 3/2019 | Merriman et al. |
| 2019/0094685 A1 | 3/2019 | Marks et al. |

(56) References Cited

U.S. PATENT DOCUMENTS

| | | |
|---|---|---|
| 2019/0115206 A1 | 4/2019 | Kim et al. |
| 2019/0129307 A1 | 5/2019 | Kwon et al. |
| 2019/0137870 A1 | 5/2019 | Meyers et al. |
| 2019/0153001 A1 | 5/2019 | Cardineau et al. |
| 2019/0157066 A1 | 5/2019 | Zhou et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0198338 A1 | 6/2019 | Kim et al. |
| 2019/0214295 A1 | 7/2019 | Yoon et al. |
| 2019/0244805 A1 | 8/2019 | Tan et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0341256 A1 | 11/2019 | Shankar et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0391486 A1 | 12/2019 | Jiang et al. |
| 2019/0393035 A1 | 12/2019 | O'Meara et al. |
| 2020/0051781 A1 | 2/2020 | Fujimura et al. |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0096858 A1 | 3/2020 | Lin |
| 2020/0118835 A1 | 4/2020 | Kanarik |
| 2020/0124970 A1 | 4/2020 | Kocsis et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0393765 A1 | 12/2020 | Sakanishi |
| 2020/0402801 A1 | 12/2020 | Shamma et al. |
| 2021/0013034 A1 | 1/2021 | Wu et al. |
| 2021/0397085 A1 | 12/2021 | Weidman et al. |
| 2022/0020584 A1 | 1/2022 | Volosskiy et al. |
| 2022/0035247 A1 | 2/2022 | Tan et al. |
| 2022/0043334 A1 | 2/2022 | Tan et al. |
| 2022/0075260 A1 | 3/2022 | Marks et al. |
| 2022/0093413 A1 | 3/2022 | Kanarik |
| 2022/0157617 A1 | 5/2022 | Zhou et al. |
| 2022/0216050 A1 | 7/2022 | Yu et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0365434 A1 | 11/2022 | Nardi et al. |
| 2023/0031955 A1 | 2/2023 | Yu et al. |
| 2023/0045336 A1 | 2/2023 | Yu et al. |
| 2023/0107357 A1 | 4/2023 | Dictus et al. |
| 2023/0185196 A1 | 6/2023 | Weidman et al. |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0273516 A1 | 8/2023 | Marks et al. |
| 2023/0288798 A1 | 9/2023 | Hansen et al. |
| 2023/0314946 A1 | 10/2023 | Hansen et al. |
| 2023/0343593 A1 | 10/2023 | Nagabhirava et al. |
| 2024/0429045 A1 | 12/2024 | Yu et al. |

FOREIGN PATENT DOCUMENTS

| | | |
|---|---|---|
| CN | 102610516 A | 7/2012 |
| CN | 103119695 A | 5/2013 |
| CN | 103243310 A | 8/2013 |
| CN | 103748658 A | 4/2014 |
| CN | 105579906 A | 5/2016 |
| CN | 106067513 A | 11/2016 |
| CN | 106876251 A | 6/2017 |
| CN | 108351586 A | 7/2018 |
| CN | 108351594 A | 7/2018 |
| CN | 108388079 A | 8/2018 |
| CN | 109521657 A | 3/2019 |
| CN | 109976097 A | 7/2019 |
| CN | 111258190 A | 6/2020 |
| EP | 1123423 B1 | 8/2007 |
| EP | 2256789 A1 | 12/2010 |
| EP | 2608247 A1 | 6/2013 |
| EP | 3230294 A1 | 10/2017 |
| EP | 3258317 A1 | 12/2017 |
| JP | H03263827 A | 11/1991 |
| JP | H06326060 A | 11/1994 |
| JP | H07106224 A | 4/1995 |
| JP | H08339950 A | 12/1996 |
| JP | H10209133 A | 8/1998 |
| JP | 2001255670 A | 9/2001 |
| JP | 2001358218 A | 12/2001 |
| JP | 2002023390 A | 1/2002 |
| JP | 2003213001 A | 7/2003 |
| JP | 2003532303 A | 10/2003 |
| JP | 2004006798 A | 1/2004 |
| JP | 2004363444 A | 12/2004 |
| JP | 2005504146 A | 2/2005 |
| JP | 2006253282 A | 9/2006 |
| JP | 2009192350 A | 8/2009 |
| JP | 2010016083 A | 1/2010 |
| JP | 2010016314 A | 1/2010 |
| JP | 2010062363 A | 3/2010 |
| JP | 2010219106 A | 9/2010 |
| JP | 2010531931 A | 9/2010 |
| JP | 2010239087 A | 10/2010 |
| JP | 2011520242 A | 7/2011 |
| JP | 2011253185 A | 12/2011 |
| JP | 2011529126 A | 12/2011 |
| JP | 2012142481 A | 7/2012 |
| JP | 2012173315 A | 9/2012 |
| JP | 2012185485 A | 9/2012 |
| JP | 5055743 B2 | 10/2012 |
| JP | 2012529777 A | 11/2012 |
| JP | 2013096011 A | 5/2013 |
| JP | 2013517600 A | 5/2013 |
| JP | 2013526061 A | 6/2013 |
| JP | 2013145874 A | 7/2013 |
| JP | 5544914 B2 | 7/2014 |
| JP | 2014521111 A | 8/2014 |
| JP | 5705103 B2 | 4/2015 |
| JP | 2015513540 A | 5/2015 |
| JP | 2015201622 A | 11/2015 |
| JP | 2016028424 A | 2/2016 |
| JP | 2016131238 A | 7/2016 |
| JP | 2016529330 A | 9/2016 |
| JP | 2016532311 A | 10/2016 |
| JP | 2016208027 A | 12/2016 |
| JP | 2016208031 A | 12/2016 |
| JP | 2017503359 A | 1/2017 |
| JP | 2017045869 A | 3/2017 |
| JP | 2017108053 A | 6/2017 |
| JP | 2017116923 A | 6/2017 |
| JP | 2017191938 A | 10/2017 |
| JP | 2017199909 A | 11/2017 |
| JP | 2018017780 A | 2/2018 |
| JP | 2018518688 A | 7/2018 |
| JP | 2019500490 A | 1/2019 |
| JP | 2019506730 A | 3/2019 |
| JP | 2019053305 A | 4/2019 |
| JP | 2019135755 A | 8/2019 |
| JP | 2019192814 A | 10/2019 |
| JP | 2021523403 A | 9/2021 |
| JP | 2021528676 A | 10/2021 |
| KR | 960000375 B1 | 1/1996 |
| KR | 100841495 B1 | 6/2008 |
| KR | 20090042059 A | 4/2009 |
| KR | 20120024544 A | 3/2012 |
| KR | 20130093038 A | 8/2013 |

(56) References Cited

FOREIGN PATENT DOCUMENTS

| | | |
|---|---|---|
| KR | 20140047120 A | 4/2014 |
| KR | 20140106442 A | 9/2014 |
| KR | 20150008065 A | 1/2015 |
| KR | 20160124689 A | 10/2016 |
| KR | 20160136303 A | 11/2016 |
| KR | 20170066225 A | 6/2017 |
| KR | 20180054917 A | 5/2018 |
| KR | 20190085654 A | 7/2019 |
| TW | 201133618 A | 10/2011 |
| TW | 201140687 A | 11/2011 |
| TW | 201224190 A | 6/2012 |
| TW | I365354 B | 6/2012 |
| TW | 201241555 A | 10/2012 |
| TW | I494689 B | 8/2015 |
| TW | 201539539 A | 10/2015 |
| TW | 201631377 A | 9/2016 |
| TW | 201643958 A | 12/2016 |
| TW | 201729006 A | 8/2017 |
| TW | 201734025 A | 10/2017 |
| TW | 201826034 A | 7/2018 |
| TW | 201903191 A | 1/2019 |
| TW | 201907445 A | 2/2019 |
| TW | 202001993 A | 1/2020 |
| TW | 202006168 A | 2/2020 |
| WO | WO-03029015 A2 | 4/2003 |
| WO | WO-2004095551 A1 | 11/2004 |
| WO | WO-2007123539 A1 | 11/2007 |
| WO | WO-2011081151 A1 | 7/2011 |
| WO | WO-2011081921 A2 | 7/2011 |
| WO | WO-2011087984 A2 | 7/2011 |
| WO | WO-2011137059 A2 | 11/2011 |
| WO | WO-2012048094 A3 | 7/2012 |
| WO | WO-2013007442 A1 | 1/2013 |
| WO | WO-2014152023 A1 | 9/2014 |
| WO | WO-2016065120 A1 | 4/2016 |
| WO | WO-2016144960 A1 | 9/2016 |
| WO | WO-2016158864 A1 | 10/2016 |
| WO | WO-2017066319 A2 | 4/2017 |
| WO | WO-2017109040 A1 | 6/2017 |
| WO | WO-2017198418 A1 | 11/2017 |
| WO | WO-2018004551 A1 | 1/2018 |
| WO | WO-2018061670 A1 | 4/2018 |
| WO | WO-2019163455 A1 | 8/2019 |
| WO | WO-2019217749 A1 | 11/2019 |
| WO | WO-2019222320 A1 | 11/2019 |
| WO | WO-2019230462 A1 | 12/2019 |
| WO | WO-2019241402 A1 | 12/2019 |
| WO | WO-2020030855 A2 | 2/2020 |
| WO | WO-2020102085 A1 | 5/2020 |
| WO | WO-2020132281 A1 | 6/2020 |
| WO | WO-2020223011 A1 | 11/2020 |
| WO | WO-2020263750 A1 | 12/2020 |
| WO | WO-2020264557 A1 | 12/2020 |
| WO | WO-2021067632 A2 | 4/2021 |
| WO | WO-2021072042 A1 | 4/2021 |

OTHER PUBLICATIONS

Chinese First Office Action dated May 24, 2017 issued in Application No. CN 201510053668.7.

Chinese Second Office Action dated Feb. 28, 2018 issued in Application No. CN 201510053668.7.

Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.

Fan, Y. et al., (2016) "Benchmarking Study of EUV Resists for NXE:3300B," Proc. of SPIE, 9776:97760W-1 to 97760W-11 [Downloaded From http://proceedings.spiedigitallibrary.org/ on Mar. 30, 2017].

Faraz et al., (2015) "Atomic Layer Etching: What Can We Learn from Atomic Layer Deposition?," ECS Journal of Solid State Science and Technology, 4(6):N5023-N5032.

Fujifilm Corp., (Presentation) "Negative tone development process for double patterning," 5th International Symposium on Immersion Lithography, Sep. 2008, Presentation Slides No. P-1-P-27.

Fujifilm Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.

Gangnaik, A.S. et al., (Jan. 12, 2017) "New Generation Electron Beam Resists: A Review," Chem. Mater., 29:1898-1917.

Gerritsen et al., (Apr. 1, 1986) "Laser-generated plasma as soft x-ray source," J. Appl. Phys., 59(7):2337-2344.

International Preliminary Report on Patentability dated Jul. 4, 2019 issued in Application No. PCT/US2017/066470.

International Preliminary Report on Patentability dated Nov. 28, 2019 issued in Application No. PCT/US2018/032783.

International Preliminary Report on Patentability dated Nov. 7, 2019 issued in Application No. PCT/US2018/028192.

International Preliminary Report on Patentability dated Sep. 30, 2021 issued in Application No. PCT/US2020/023146.

International Search Report and Written Opinion dated Apr. 5, 2018 issued in Application No. PCT/US2017/066470.

International Search Report and Written Opinion dated Aug. 8, 2018 issued in Application No. PCT/US2018/028192.

International Search Report and Written Opinion dated Jul. 17, 2020 issued in Application No. PCT/US2020/023146.

International Search Report and Written Opinion dated Nov. 26, 2018 issued in Application No. PCT/US18/42024.

International Search Report and Written Opinion dated Oct. 16, 2018 issued in Application No. PCT/US2018/032783.

Japanese Decision to Grant dated Feb. 12, 2019 issued in Application No. JP 2015-016254.

Japanese Decision to Grant dated May 3, 2021 issued in Application No. JP 2016-220096.

Japanese First Office Action dated Oct. 30, 2018 issued in Application No. JP 2015-016254.

Japanese First Office Action dated Sep. 15, 2020 issued in Application No. JP 2016- 220096.

Kanarik et al. (Aug. 2018) "Atomic Layer Etching: Rethinking the Art of Etch" The Journal of Physical Chemistry Letters, vol. 9, pp. 4814-4821. doi:10.1021/acs.jpclett.8b00997.

Kanarik et al. (Mar./Apr. 2015) "Overview of atomic layer etching in the semiconductor industry," J. Vac. Sci. Technol. A, 33(2):020802-1-020802-14.

Kanarik et al. (Nov. 2016) "Tech Brief: All About ALE" [webpage] pp. 1-3. URL:https://blog.lamresearch.com/tech-brief-all-about-ale/.

Kanarik et al., (Sep./Oct. 2017) "Predicting synergy in atomic layer etching," J. Vac. Sci. Technol. A,35(5):05C302-1 through 05C302-7.

Korean Decision for Grant dated Sep. 2, 2021 issued in Application No. KR 10-2015-0015184.

Korean First Office Action dated Dec. 22, 2020 issued in Application No. KR 10-2015-0015184.

Korean Second Office Action dated Jul. 27, 2021 issued in Application No. KR 10-2015-0015184.

McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.

Rothschild, et al., "Liquid immersion lithography: Why, how, and when?" Journal Vacuum Science Technology, Nov./Dec. 2004, pp. 2877-2881.

Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.

Spitzer et al., (Mar. 1, 1986) "Conversion efficiencies from laser-produced plasmas in the extreme ultraviolet regime," J. Appl. Phys., 79(5):2251-2258.

Stowers et al.; "Directly patterned inorganic hard mask for EUV lithography"; proceedings of the SPIE 7969; Extreme Ultraviolet (EUV) Lithography 11, 796915-1-11 (Apr. 7, 2011), event: SPI E Advanced Lithography, 2011, San Jose California.

(56) References Cited

OTHER PUBLICATIONS

Stulen, et al., "Extreme Ultraviolet Lithography" IEEE Journal of Quantum Electronics, vol. 35, No. 5, May 1999, pp. 694-699.
Taiwanese First Office Action dated Aug. 10, 2020 issued in Application No. TW 105137362.
Taiwanese First Office Action dated Jul. 23, 2020 issued in Application No. TW 106103603.
Taiwanese First Office Action dated Jun. 17, 2021 issued in Application No. TW 106144335.
Taiwanese First Office Action dated May 31, 2018 issued in Application No. TW 104103153.
Taiwanese Second Office Action dated Nov. 18, 2020 issued in Application No. TW 105137362.
TW First Office Action dated Oct. 6, 2021, in application No. TW20180116415 with English translation.
TW office Action dated Dec. 2, 2021, in application No. TW20180113670 with English translation.
U.S. Appl. No. 17/457,909, Inventors Shamma, filed on Dec. 6, 2020.
US Final Office Action, dated Feb. 5, 2019 issued in U.S. Appl. No. 15/495,701.
US Final Office Action dated Jul. 9, 2021 issued in U.S. Appl. No. 16/717,385.
U.S. Final Office Action dated Mar. 8, 2019 issued in U.S. Appl. No. 15/654,612.
US Final Office Action, dated May 11, 2017, issued in U.S. Appl. No. 14/610,038.
US Final Office Action, dated Sep. 10, 2018, issued in U.S. Appl. No. 15/691,659.
US Final Office Action dated Sep. 16, 2019 issued in U.S. Appl. No. 15/841,205.
US Notice of Allowance, dated Apr. 25, 2018 issued in U.S. Appl. No. 14/948,109.
US Notice of Allowance dated Apr. 25, 2018 issued in U.S. Appl. No. 15/421,189.
U.S. Notice of Allowance dated Aug. 1, 2019 issued in U.S. Appl. No. 15/654,612.
US Notice of Allowance, dated Aug. 22, 2017, issued in U.S. Appl. No. 14/610,038.
US Notice of Allowance dated Dec. 13, 2018 issued in U.S. Appl. No. 15/494,245.
US Notice of Allowance dated Dec. 2, 2019 issued in U.S. Appl. No. 15/841,205.
US Notice of Allowance dated Dec. 2, 2019 issued in U.S. Appl. No. 16/049,320.
US Notice of Allowance dated Jan. 26, 2018 issued in U.S. Appl. No. 15/582,359.
US Notice of Allowance, dated Jul. 28, 2020, issued in U.S. Appl. No. 16/206,959.
US Notice of Allowance, dated Jun. 10, 2020 issued in U.S. Appl. No. 15/979,340.
US Notice of Allowance dated Oct. 6, 2017 issued in U.S. Appl. No. 15/582,359.
US Notice of Allowance dated Sep. 15, 2021, issued in U.S. Appl. No. 16/691,508.
US Notice of Allowance, dated Sep. 19, 2019, issued in U.S. Appl. No. 15/691,659.
US Notice of Allowance dated Sep. 22, 2021 issued in U.S. Appl. No. 16/717,385.
US Notice of Allowance, dated Sep. 30, 2021 issued in U.S. Appl. No. 17/008,095.
US Notice of Allowance dated Sep. 9, 2021, issued in U.S. Appl. No. 16/691,508.
U.S. Notice of Allwance dated Jul. 14, 2020 issued in U.S. Appl. No. 15/955,099.
US Office Action dated Apr. 10, 2019 issued in U.S. Appl. No. 15/841,205.
US Office Action dated Apr. 19, 2018 issued in U.S. Appl. No. 15/494,245.
US Office Action, dated Apr. 9, 2019, issued in U.S. Appl. No. 15/691,659.
U.S. Office Action dated Aug. 10, 2018 issued in U.S. Appl. No. 15/654,612.
US Office Action, dated Aug. 9, 2018 issued in U.S. Appl. No. 15/495,701.
U.S. Office Action dated Dec. 30, 2019 issued in U.S. Appl. No. 15/955,099.
US Office Action dated Feb. 26, 2021 issued in U.S. Appl. No. 16/717,385.
US Office Action, dated Jan. 23, 2017, issued in U.S. Appl. No. 14/610,038.
US Office Action, dated Mar. 18, 2021 issued in U.S. Appl. No. 17/008,095.
US Office Action, dated Mar. 5, 2020, issued in U.S. Appl. No. 16/206,959.
US Office Action dated May 14, 2021, issued in U.S. Appl. No. 16/691,508.
US Office Action, dated May 21, 2018, issued in U.S. Appl. No. 15/691,659.
US Office Action, dated Nov. 2, 2017, issued in U.S. Appl. No. 14/948,109.
US Office Action dated Nov. 29, 2017 issued in U.S. Appl. No. 15/421,189.
US Office Action, dated Nov. 6, 2019 issued in U.S. Appl. No. 15/979,340.
US Office Action dated Sep. 6, 2019 issued in U.S. Appl. No. 16/049,320.
U.S. Appl. No. 17/593,371, inventors Zhou et al., filed on Sep. 16, 2021.
Wang, et al., "Lithography Simulation for the Fabrication of Silicon Photonic Devices with Deep-Ultraviolet Lithography" IEEE, (2012) pp. 288-290.
Banerjee, D. et al., "Potential of Metal-Organic Frameworks for Separation of Xenon and Krypton", Accounts of Chemical Research, 2015, vol. 48, No. 2, pp. 211-219.
Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
CN Office Action dated Dec. 13, 2023 in CN Application No. 201810783756.6 with English translation.
CN Office Action dated Jul. 23, 2024 in CN Application No. 201810783756.6 with English translation.
CN Office Action dated Jun. 1, 2023, in application No. CN201810783756 with English translation.
CN Office Action dated Jun. 8, 2022 in Application No. CN202180002531.2 With English Translation.
CN Office Action dated Jun. 28, 2024 in CN Application No. 202080032750 with English translation.
CN Office Action dated Mar. 10, 2022, in Application No. CN20188047574.0 With English Translation.
CN Office Action dated Mar. 10, 2023, in Application No. CN201780086828.5 with English translation.
CN Office Action dated Mar. 14, 2024 in CN Application No. 201810783756.6, with English Translation.
CN Office Action dated Mar. 18, 2023, in Application No. CN201810371597.9 with English translation.
CN Office Action dated Mar. 31, 2023, in Application No. CN201880046648.9 with English translation.
CN Office Action dated Nov. 16, 2022, in Application No. CN202180002531.2 with English translation.
CN Office Action dated Nov. 18, 2022, in Application No. CN201810783756.6 With English Translation.
CN Office Action dated Oct. 31, 2023 in CN Application No. CN201780086828.5 with English translation.
Dahuang, D., et al., Functional Thin Films and Their Deposition Preparation Techniques, Metallurgy Industrial Press, Jan. 31, 2013, pp. 450-454. [with English Translation].
Danilo D.E., et al., "Metal Containing Resist Readiness for HVM EUV Lithography", Journal of Photopolymer Science and Technology, 2016, vol. 29(3), pp. 501-507.
European Search Report dated Feb. 15, 2022, in Application No. EP21741104.

(56) References Cited

OTHER PUBLICATIONS

European Office Action dated Feb. 25, 2022 in Application No. 21741104.
Extended European Search Report dated Dec. 23, 2021, in Application No. EP19800353.5.
Gross, R.A. et al., "Biodegradable Polymers for the Environment", Science, Aug. 2, 2002, vol. 297, No. 5582, pp. 803-807.
Hamley, I.W., "Nanostructure fabrication using block copolymers", Nanotechnology. Sep. 2003. 17;14(10):R39-R54.
Harrisson, S. et al., "RAFT Polymerization of Vinyl Esters: Synthesis and Applications", Polymers, 2014, vol. 6, No. 5, pp. 1437-1488.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.
International Preliminary Report on Patentability dated Jan. 30, 2020, in Application No. PCT/US2018/042024.
International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Nov. 11, 2021, for International Application No. PCT/US2020/028151.
International Preliminary Report on Patentability dated Sep. 9, 2022, in PCT Application No. PCT/US2021/019245.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Jul. 31, 2020, in PCT Application No. PCT/US2020/028151.
International Search Report and Written Opinion dated Mar. 23, 2021 issued in Application No. PCT/US2020/053856.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Nov. 11, 2022 in PCT Application No. PCT/US2022/037733.
International Search Report and Written Opinion dated Nov. 26, 2018, in Application No. PCT/US2018/042024.
International Search Report and Written Opinion dated Oct. 8, 2020 in Application No. PCT/US2020/038968.
International Search Report and Written Opinion dated Oct. 13, 2021, in application No. PCT/US2021/037924.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
Joo, W. et al., "Synthesis of Unzipping Polyester and a Study of its Photochemistry", Journal of the American Chemical Society, 2019, vol. 141, No. 37, pp. 14736-14741.
JP Office Action dated Jul. 26, 2022 in Application No. JP2021102822 With English translation.
JP Office Action dated Nov. 15, 2022, in Application No. JP2021-176082 with English translation.
JP Office Action dated May 10, 2022, in Application No. JP2018-081932 with English translation.
JP Office Action dated Jan. 5, 2022, in Application No. JP2019-533041 with English translation.
JP Office Action dated Jun. 14, 2022, in Application No. JP20190563508 with English translation.
JP Office Action dated Mar. 12, 2024 in JP Application No. 2022-202758, with English Translation.
JP Office Action dated May 31, 2022, in Application No. JP20190533041 with English Translation.
JP Office Action dated Nov. 12, 2024 in JP Application No. 2022-550875 with English translation.
JP Office Action dated Sep. 5, 2023 in Application No. JP2022-202758 with English Translation.
JP Office Action dated Sep. 17, 2024 in JP Application No. 2023-502905 with English translation.
JP Office Action dated Sep. 17, 2024 in JP Application No. 2023-502907, with English Translation.

(56) References Cited

OTHER PUBLICATIONS

Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
KR Notice of Allowance dated Dec. 12, 2024 in KR Application No. 10-2016-0152489, with English Translation.
KR Notice of Allowances dated Sep. 5, 2024 in KR Application No. 10-2023-7034721 with English Translation.
KR Office Action dated Feb. 8, 2022, in Application No. KR10-2021-7030794 with English Translation.
KR Office Action dated Apr. 23, 2024 in KR Application No. 10-2016-0152489 with English translation.
KR Office Action dated Apr. 30, 2024 in KR Application No. 10-2017-0014362 with English translation.
KR Office Action dated Aug. 25, 2022, in Application No. KR10-2019-7020687 with English translation.
KR Office Action dated Dec. 5, 2023 in KR Application No. 10-2020-7004764 with English Translation.
KR Office Action dated Dec. 6, 2023, in application No. 10-2023-7034721, with English Translation.
KR Office Action dated Feb. 2, 2023 in Application No. KR10-2018-0046846 with English translation.
KR Office Action dated Feb. 28, 2023, in Application No. KR10-2019-7020687 with English translation.
KR Office Action dated Jun. 28, 2024 in KR Application No. 10-2021-7033470, with English Translation.
KR Office Action dated Mar. 3, 2023, in Application No. KR10-2019-7021389 with English translation.
KR Office Action dated May 9, 2022, in Application No. KR1020217030794 with English translation.
KR Office Action dated May 25, 2023, in application No. KR10-2019-7037210 with English translation.
KR Office Action dated Nov. 7, 2024 in KR Application No. 10-2023-7005181 with English Translation.
KR Office Action dated Nov. 7, 2024 in KR Application No. 10-2023-7005318, with English Translation.
KR Office Action dated Sep. 13, 2022, in Application No. KR10-2019-7021389 With English Translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.
Molloy, K. C., "Precursors for the Formation of Tin (IV) Oxide and Related Materials", Journal of Chemical Research, 2008, vol. 2008, No. 10, pp. 549-554.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.

Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Shestaeva, et al., Mechanical, structural, and optical properties of PEALD metallic oxides for optical applications, Applied Optics, vol. 56, No. 4, Feb. 1, 2017). (Year: 2017).
Sundberg, P. et al., "Organic and Inorganic-organic Thin Film Structures by Molecular Layer Deposition: A Review", Beilstein Journal of Nanotechnology, 2014, vol. 5, pp. 1104-1136.
TW Office Action dated Jan. 9, 2023 In Application No. TW20190116155 with English translation.
TW Office Action dated Jan. 14, 2022, in Application No. TW106144335 with English translation.
TW Office Action dated Sep. 5, 2022, in Application No. TW110101388 with English translation.
TW Office Action dated Sep. 8, 2022 in Application No. TW111123386 with English translation.
TW Office Action dated Apr. 29, 2022 in Application No. TW110118172 with English translation.
TW Office Action dated Aug. 9, 2023, in application No. TW109114280 with English Translation.
TW Office Action dated Jan. 13, 2023, in Application No. TW110124741 with English translation.
TW Office Action dated Jan. 19, 2023 in Application No. TW110141961 with English translation.
TW Office Action dated Jul. 10, 2023 in Application No. TW109108753 with English Translation.
TW Office Action dated Jul. 23, 2024 in TW Application No. 110111878, with English Translation.
TW Office Action dated Mar. 7, 2022, in Application No. TW110101388 with English translation.
TW Office Action dated Nov. 25, 2024 in TW Application No. 110126458, with English Translation.
TW Office Action dated Nov. 26, 2024 in TW Application No. 110126445, with English Translation.
TW Office Action dated Oct. 4, 2024 in TW Application No. 110126430 with English translation.
TW Office Action dated Sep. 12, 2024 in TW Application No. 110107029 with English translation.
U.S. Advisory Action dated May 7, 2024 in U.S. Appl. No. 18/298,003.
U.S. Corrected Notice of Allowance dated Jul. 8, 2024 in U.S. Appl. No. 17/594,744.
U.S. Corrected Notice of Allowance dated Jun. 27, 2024 in U.S. Appl. No. 17/593,371.
U.S. Corrected Notice of Allowance dated Sep. 26, 2024 in U.S. Appl. No. 17/593,371.
U.S. Final Office Action dated Feb. 27, 2024 in U.S. Appl. No. 18/298,003.
U.S. Final Office Action dated May 3, 2024 in U.S. Appl. No. 18/297,989.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final Office Action dated Aug. 7, 2024 in U.S. Appl. No. 17/759,896.
U.S. Non-Final office Action dated Feb. 7, 2023 in U.S. Appl. No. 17/455,185.
U.S. Non-Final Office Action dated May 29, 2024 in U.S. Appl. No. 18/298,003.
U.S. Non-Final Office Action dated Nov. 3, 2023, in U.S. Appl. No. 17/594,744.
U.S. Non-Final Office Action dated Nov. 24, 2023 in U.S. Appl. No. 17/593,371.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.
U.S. Notice of Allowance dated Apr. 3, 2023 in U.S. Appl. No. 17/457,909.

(56) References Cited

OTHER PUBLICATIONS

U.S. Notice of Allowance dated Apr. 10, 2023 in U.S. Appl. No. 17/457,909.
U.S. Notice of Allowance dated Dec. 22, 2022 in U.S. Appl. No. 17/457,909.
U.S. Notice of Allowance dated Feb. 22, 2022 in U.S. Appl. No. 17/310,635.
U.S. Notice of Allowance dated Jun. 20, 2024 in U.S. Appl. No. 17/593,371.
U.S. Notice of Allowance dated Mar. 27, 2024 in U.S. Appl. No. 17/594,744.
U.S. Notice of Allowance dated Nov. 21, 2024 in U.S. Appl. No. 17/759,896.
U.S. Appl. No. 18/005,571 inventors Hansen et al., filed on Jan. 13, 2023.
U.S. Appl. No. 18/005,594, inventors Hansen et al., filed on Jan. 13, 2023.
U.S. Appl. No. 18/932,475, inventors Marks J, et al., filed on Oct. 30, 2024.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
U.S. Supplemental Notice of Allowability dated Jan. 26, 2022, in U.S. Appl. No. 17/008,095.
Xu, et al., "Underlayer designs to enhance the performance of EUV resists," Proceedings of SPIE, vol. 7273, 2009, pp. 727311-1-727311-11.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.

\* cited by examiner

ELIMINATING YIELD IMPACT OF STOCHASTICS IN LITHOGRAPHY

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in their entireties and for all purposes.

BACKGROUND

Patterning methods are critical to semiconductor processing. In particular, extreme ultraviolet (EUV) lithography has been explored to extend lithographic technology beyond its optical limits and replace current photolithography methods to pattern small critical dimension features. Current EUV lithography methods result in poor edge roughness and weak patterns that may ultimately render the substrate useless.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Methods and apparatuses for processing semiconductor substrates are described herein. One aspect involves a method of processing semiconductor substrates, the method including: providing a substrate having a first feature and a second feature formed by lithography in a first hard mask material, whereby the first feature is partially formed by the lithography and includes a bottom, and the first hard mask material includes a field region between feature openings of the first feature and the second feature; depositing a second hard mask material over the first hard mask material for a duration sufficient to preferentially form second hard mask material on the field region to a thickness greater than thickness of the second hard mask material in the first feature; and directionally etching the second hard mask material to remove material at the bottom of the first feature, whereby the material at the bottom of the first feature is the first hard mask material or the second hard mask material.

In various embodiments, the directionally etching is performed to etch through the second hard mask material and expose a third hard mask material under the first hard mask material at the bottom of the first feature. In some embodiments, a bottom of the second feature includes third hard mask material under the first hard mask material.

In various embodiments, an amount of the second hard mask material deposited into the first and second features depends on aspect ratio of the first feature and aspect ratio of the second feature.

In various embodiments, directionally etching is performed independent of aspect ratios of the first and second features.

In various embodiments, aspect ratio of the first feature is different from aspect ratio of the second feature.

In various embodiments, depth of the first feature is different from depth of the second feature.

In various embodiments, the first feature is underexposed during lithography.

In various embodiments, critical dimension of the first feature after the depositing and the directionally etching is within about 0.5% to about 1% of critical dimension of the second feature prior to the depositing and the directionally etching.

In various embodiments, aspect ratio of the first feature after the depositing and the directionally etching is within about 1% to about 10% of aspect ratio of aspect ratio of the second feature prior to the depositing and the directionally etching.

In various embodiments, average critical dimension of the first and second features after depositing and directionally etching is at least about 15 nm.

In various embodiments, variation in critical dimension across the first and second features on the substrate after the depositing and the directionally etching is less than variation of critical dimension across the first and second features after being lithographically defined.

In various embodiments, repeating depositing of the second hard mask material and directionally etching the second hard mask material in sufficient cycles to reduce remove the first hard mask material at the bottom of the first feature. For example, in some embodiments, the second hard mask material deposited in each cycle in the second feature protects material underlying the first hard mask material from being etched and the directionally etching in each cycle removes first hard mask material at the bottom of the first feature such that difference between depth of the first feature and depth of the second feature approaches 0.

In various embodiments, directionally etching the second hard mask material is performed by exposing the second hard mask material to an etching species to form a modified surface and igniting a plasma in an inert gas environment without the etching species while applying a bias to remove the modified surface. For example, in some embodiments, the second hard mask material is exposed to the etching species for a duration sufficient to remove between about 5 nm and about 10 nm of material in the modified surface of the second hard mask material when exposed to the plasma.

In various embodiments, the depositing of the second hard mask material is formed by chemical vapor deposition.

In various embodiments, the depositing of the second hard mask material is formed by plasma enhanced chemical vapor deposition.

In various embodiments, the second hard mask material is a carbon-containing material. For example, the carbon-containing material may be doped with any one or more of amorphous carbon, doped with an element selected from the group consisting of oxygen, nitrogen, fluorine, silicon, tin, or any other suitable elements from Group III, IV, V, VI, and VII of the Periodic Table of Elements.

In various embodiments, the second hard mask material is a silicon-containing material. In some embodiments, the silicon-containing material is silicon dioxide or silicon nitride.

In various embodiments, the second hard mask material has a composition different from that of the first hard mask material.

In various embodiments, the second hard mask material has a different lattice structure than that of the first hard mask material.

In various embodiments, the second hard mask material is a tin-containing material such as tin oxide or tin(II) oxide (SnO), stannic oxide or tin(IV) oxide ($SnO_2$).

In various embodiments, the substrate includes a third hard mask material underlying the first hard mask material. For example, the second hard mask material may have etch selectivity relative to the third hard mask material such that etch rate of the second hard mask material is at least 3 times greater than the third hard mask material. In various embodiments, the third hard mask is any one or more of silicon oxynitride, silicon-containing anti-reflective coating material, spin-on glass, bottom anti-reflective coating material, tin oxide, tin nitride, tin sulfide, lead oxide, lead nitride, and lead sulfide.

In various embodiments, a width of a feature opening of the second feature is between about 15 nm and about 100 nm.

In various embodiments, the second hard mask material deposited on the field region protects the first hard mask material during the directionally etching of the second hard mask material.

In various embodiments, the depositing of the second hard mask material and the directionally etching are performed in the same tool.

In various embodiments, the depositing of the second hard mask material and the directionally etching are performed without breaking vacuum.

In various embodiments, the first hard mask material is selected from the group consisting of photoresist and spin-on carbon.

In various embodiments, the first and second features are formed by extreme ultraviolet lithography.

In various embodiments, the first and second features are formed by immersion lithography.

Another aspect involves a method of processing semiconductor substrates, the method including: providing a substrate having a patterned photoresist, the patterned photoresist including a first feature and a second feature, whereby the first feature is partially defined and includes photoresist at a bottom of the first feature; after providing the substrate, preferentially depositing carbon-containing material on the photoresist such that more carbon-containing material is deposited at a bottom of the second feature than at the bottom of the first feature; and after depositing the carbon-containing material, performing atomic layer etching on exposed surfaces of the substrate.

In various embodiments, the atomic layer etching is performed by: exposing the exposed surfaces of the substrate to an etching species and igniting a first plasma while applying a bias to modify a surface of the exposed surfaces of the substrate and formed a modified surface, and exposing the modified surface to a second plasma for a duration sufficient to remove the modified surface. In various embodiments, a bias is applied when exposing the modified surfaces to the second plasma. In some embodiments, the modified surfaces are etched without sputtering material underlying the modified surfaces. In some embodiments, exposing surfaces of the substrate to the etching species further includes introducing a diluent inert gas such as any one or more of helium, argon, neon, krypton, and xenon.

In various embodiments, the substrate further includes an underlayer adjacent to and underlying the photoresist, and the carbon-containing material is preferentially deposited so as not to deposit on exposed regions of the underlayer.

In various embodiments, the carbon-containing material selectively deposited on the photoresist has a slower etch rate than the photoresist when exposed to the atomic layer etching.

In various embodiments, etch rate of the photoresist during atomic layer etching is faster than etch rate of the carbon-containing material.

In various embodiments, the atomic layer etching removes photoresist anisotropically.

In various embodiments, deposition thickness in the first and second features is dependent on aspect ratio of the first and second features.

In various embodiments, the photoresist is patterned by deep ultraviolet lithography.

In various embodiments, the photoresist is patterned by extreme ultraviolet lithography.

In various embodiments, the photoresist is patterned by immersion lithography. For example, in some embodiments, the immersion lithography involves exposing the photoresist to argon fluoride.

In various embodiments, preferentially depositing the carbon-containing material on the photoresist on the substrate further includes introducing methane.

In various embodiments, preferentially depositing and performing atomic layer etching are repeated in cycles until the first feature has the same critical dimension as the second feature.

Another aspect involves a method of processing semiconductor substrates, the method including: providing a substrate having a patterned photoresist, the patterned photoresist including a first feature and a second feature, whereby feature depth of the first feature is less than thickness of the patterned photoresist; after providing the substrate, depositing carbon-containing material over the patterned photoresist by plasma enhanced chemical vapor deposition; and after depositing the carbon-containing material, etching the substrate by modifying a surface of exposed surfaces on the substrate to form modified surfaces and etching the modified surfaces.

In various embodiments, the method also includes, prior to providing the substrate, forming the patterned photoresist by extreme ultraviolet lithography.

The method may also include repeating the depositing and the etching in cycles such that each cycle causes the feature depth of the first feature to approach the thickness of the patterned photoresist.

In various embodiments, the method is performed at a substrate temperature between about 0° C. and about 60° C.

In various embodiments, the carbon-containing material deposited is doped with a dopant such as an element from Group III, IV, V, VI, or VII of the Periodic Table of Elements. In various embodiments, the dopant is selected based on desired etch rate and stress properties of the carbon-containing material.

Another aspect involves an apparatus for processing semiconductor substrates, the apparatus including: one or more process chambers, each process chamber including a chuck; one or more gas inlets into the process chambers and associated flow control hardware; a plasma generator; and a controller having at least one processor and a memory, whereby the at least one processor and the memory are communicatively connected with one another, the at least one processor is at least operatively connected with the flow control hardware, and the memory stores computer executable instructions for controlling the at least one processor to at least control the flow control hardware by: causing introduction of a hard mask deposition precursor; after introducing the hard mask deposition precursor, causing stopping of the introduction of the hard mask deposition precursor; after stopping the introduction of the hard mask deposition precursor, causing introduction of a modification gas; and after introduction of the modification gas, causing introduction of an inert gas and generation of a plasma, whereby introduction of the hard mask deposition precursor, modification gas, and inert gas are performed without breaking vacuum.

In various embodiments, the hard mask deposition precursor is a carbon-containing precursor used to deposit carbon-containing material. In various embodiments, the apparatus further includes instructions for causing repeating of the introduction of the hard mask deposition precursor, modification gas, and inert gas in two or more cycles.

These and other aspects are described further below with reference to the drawings.

DETAILED DESCRIPTION

Figure 1A:
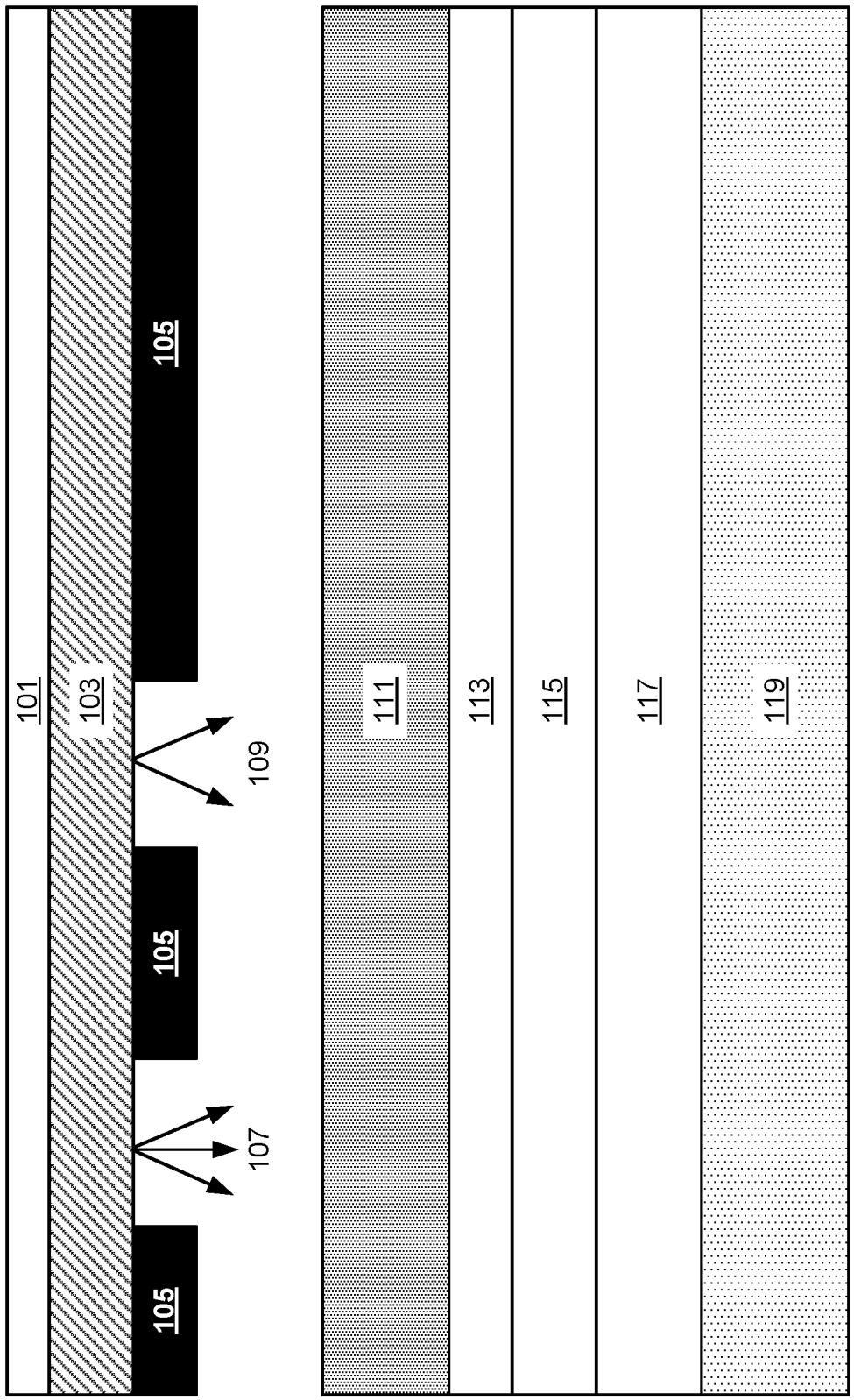
FIGS. 1A and 1B are schematic illustrations of a substrate before and after lithography respectively.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Unless otherwise stated, the processing details recited herein (e.g., flow rates, power levels, etc.) are relevant for processing 300 mm diameter substrates, or for treating chambers that are configured to process 300 mm diameter substrates, and can be scaled as appropriate for substrates or chambers of other sizes. In addition to semiconductor wafers, other work pieces that may be used with implementations disclosed herein include various articles such as printed circuit boards and the like. The processes and apparatuses can be used in the fabrication of semiconductor devices, displays, LEDs, photovoltaic panels and the like.

Patterning of thin films in semiconductor processing is often a critical operation in the manufacture and fabrication of semiconductors. Patterning may involve photolithography, such as 193 nm lithography. Stacks for lithography often include a photoresist layer deposited on a hardmask by spin-on methods. The hardmask is often made of one composition, and the hardmask itself is deposited on a target layer. In photolithography, patterns are printed by emitting photons from a photon source onto a mask and printing the pattern onto a photosensitive photoresist, thereby causing a chemical reaction in the photoresist that removes certain portions of the photoresist to form the pattern. In some lithography, the number of photons that may hit the photoresist may vary. In many practices, a large number of photons hit the photoresist, with each photon carrying less energy. Since a large number of photons may be used, the error due to some stray photons does not substantially affect the resulting defined pattern.

As devices shrink, the need for printing smaller features increases. Although multiple patterning techniques have been developed for use with some photolithography, multiple patterning uses multiple layers of deposition and etching processes. Scaling of features on advanced semiconductor integrated circuits (ICs) and other devices has driven lithography to improve resolution by moving to ever smaller imaging source wavelengths.

Extreme ultraviolet (EUV) lithography is considered a potential technique to extend the resolution limits of lithography. EUV lithography has been developed to print smaller patterns on a photoresist using EUV light sources at approximately 13.5 nm wavelength in leading-edge lithography tools, which are also referred to as scanners. The EUV radiation is strongly absorbed in a wide range of materials, including quartz and water, and so in some cases operates in a vacuum.

In EUV lithography, as shorter wavelength photons are used, fewer photons are emitted from the source and thus fewer photons hit the photoresist to form the pattern. Each of the photons carries higher energy than the photons used in some other lithography methods. Moreover, in EUV lithography fewer higher energy photons hit the photoresist so a few stray photons that miss the photosensitive sites may cause a larger error in the defined pattern. Compared to some lithography methods where more lower-energy photons are used and a few stray photons may not affect the pattern substantially, the stochastic effect due to photons in EUV lithography is of particular concern. As devices shrink, the use of fewer photons results in a higher degree of variability in features formed, as not every feature being formed will necessarily be exposed to the same number of photons. Additionally, photons may not be evenly dispersed and may not be dense, therefore resulting in variability of feature formation over the surface of a wafer. The photoresist may also absorb photons differently, thus forming complete, well-defined features in some areas of the photoresist while forming partially defined features in other areas of the same photoresist. Effects of photon or sensitizer shot noise are observed (locally) over a range (length scale) of only a few nanometers. This is especially challenging to compensate with current process control methodologies, schemes, tools, and algorithms, as they operate over larger length scales (e.g. millimeters or centimeters).

Thus, some EUV lithography methods result in poor edge roughness, distorted patterns, and inconsistent feature sizes that may ultimately render the substrate useless. Poor edge roughness is primarily a result of stochastic variation of incident photons and absorbed EUV photons inside the photoresist. Other factors underpinning the edge roughness problem include random distribution of sensitizer molecules in the photoresist film as well as variability in the photoresist polymer chain lengths which are dissolved in the developer and subsequently removed in the develop process. These stochastic processes, can result in significant photoresist residue inside the via hole, after the lithography process, and therefore, may have a deleterious effect on open circuit electrical failure (yield loss) of very large via arrays in advanced chip designs which utilize hundreds of millions to several trillion vias.

Figure 1B:
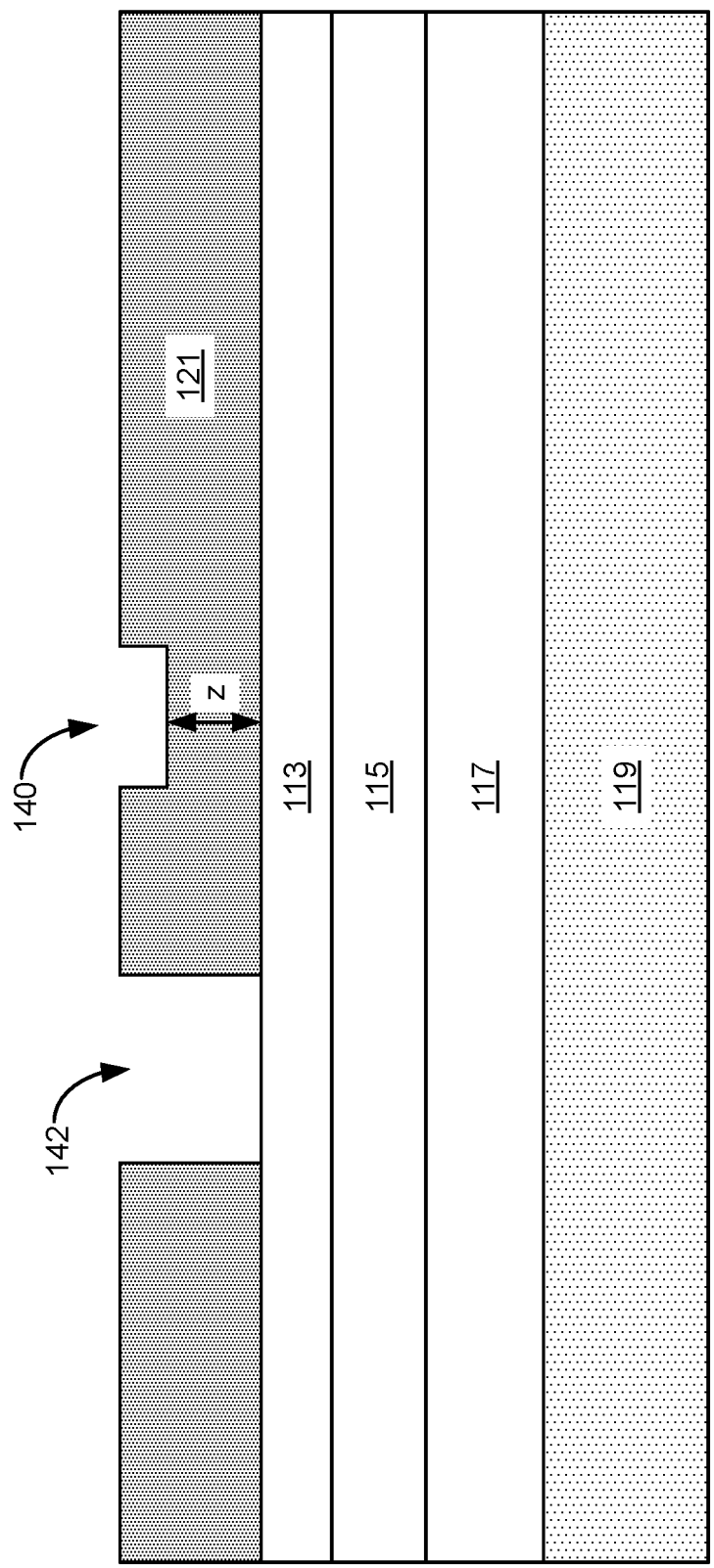

Although EUV lithography is described with respect to FIGS. 1A and 1B, it will be understood that certain disclosed embodiments are suitable for processing any substrates exposed to any type of lithography. In some embodiments, certain disclosed embodiments may also be suitable for processing substrates previously etched by other techniques where etching is inconsistent across a substrate resulting in partially defined features and some fully defined features.

FIG. 1A shows a simplified ultraviolet (UV) photomask including a glass substrate 101, multilayer mirror 103, and absorber 105 with EUV photons 107 and 109 emitted to etch the EUV photoresist 111 in the substrate stack, which also includes three hard masks (adjacent underlayer 113, hard mask 115, and hard mask 117) and a target layer 119, which may be a silicon wafer. In the lithography operation, adjacent features may receive different exposure dose due to photon shot noise or non-uniform absorption of the exposing radiation in the photoresist film. Thus, more EUV photons 107 are depicted than EUV photons 109 due to fewer photons used in EUV lithography.

FIG. 1B shows the photoresist pattern after the lithography operation (incoming to etch), indicating a random closed via (i.e. defect) referred to herein as first feature 140 has smaller critical dimension next to a properly patterned via hole, referred to herein as the second feature, 142 (having the desired critical dimension) in the patterned photoresist 121. Features as described herein refer to negative features. It will be understood that in various embodiments, the second feature may not necessarily be a fully properly patterned via hole, but may have a sufficient feature depth such that some etching of the bottom of the feature is sufficient to expose the adjacent underlayer 113.

Where second feature 142 is a fully defined feature, the second feature 142 may have a critical dimension between about 10 nm and about 100 nm. Where second feature 142 is a fully defined feature, the second feature 142 may have an aspect ratio between about 1:1 and about 3:1.

In various embodiments, the critical dimension of first feature 140 is within about 30% to about 50% of the critical dimension of the second feature 142. In various embodiments, the aspect ratio of first feature 140 is within about 150% to about 250% of the aspect ratio of the second feature 142. In some embodiments, the aspect ratio of the first feature 140 is the same as the aspect ratio of the second feature 142.

While some modified lithographic techniques involve increasing the number of photons to address the stochastic problem of using fewer photons, increasing the number of photons used increases cost resulting in an economically infeasible process with slow throughput. For example, some processes that involve increasing the number of photons to define the features of the photoresist have a throughput of about 40 wafers per hour, whereas economically feasible techniques require at least a throughput of 125 wafers per hour.

Provided herein are methods and apparatuses for eliminating the impact of stochastics on electrical (open circuit) yield. Methods and apparatuses are particularly suitable for eliminating effects of stochastics for random variability of feature sizes, aspect ratios, and depths across a substrate that occurs as a result of some lithography techniques such as EUV lithography. Methods involve performing aspect-ratio-dependent deposition of a hard mask material followed by aspect-ratio-independent etching of partially etched features previously formed by lithography techniques. Some methods involve performing a combination of selective deposition and cyclic etching to mend defective holes that are not sufficiently etched using EUV lithography. One example of cyclic etching is atomic layer etching (ALE) or, in some embodiments, super-saturated ALE. In some embodiments, selective deposition may be selective carbon deposition (SCD). While embodiments herein refer to performing certain disclosed embodiments on carbon-containing material and depositing carbon-containing material, it will be understood that in some embodiments, methods may also be applicable to other, non-carbon-containing materials. One non-limiting example includes silicon-containing materials, such as amorphous silicon or silicon oxide.

Further, embodiments herein are not limited to mending defective features formed by EUV lithography. Disclosed embodiments may be suitable for mending defective features in deep ultraviolet (DUV) lithography, or immersion lithography, or other hole patterning processes that cause defects. Defects described herein refer to incomplete etching of features such that features etched on a substrate vary in depth due to stochastic effects. A defect may be a partially etched feature on a substrate. In some embodiments, a defect is caused by stochastic effects. Methods may be suitable for defect density reduction due to photoresist residue of other patterns such as gratings (line-space patterns). Certain disclosed embodiments involve anisotropically etching photoresist faster than the deposited material.

Methods and apparatuses described herein are particularly suitable for forming vias having a feature width between about 15 nm and about 100 nm. In some embodiments, forming features of this size in a photoresist using EUV lithography results in stochastic effects in feature etching resulting in a substrate having partially defined features, and certain disclosed embodiments are capable of being performed on a substrate having both fully defined and partially defined features to reduce the variation in feature sizes between the fully defined and partially defined features over various cycles of aspect ratio dependent deposition and aspect ratio independent etching. Partially defined features as described refer to features that were underexposed (which may occur for positive tone imaging, and overexposed for negative tone imaging (where nominally unexposed photoresist is removed during development)) and/or not completely etched and/or not having the same critical dimension as the largest feature formed from the lithography (e.g., the ones that have been subject to stochastic effects resulting in incomplete etch). Partially defined features may be referred to herein as having a "defect" or being a "defective feature." The partially defined feature may, in various embodiments, have a feature depth less than the feature depth of either a fully defined feature or the largest feature formed from lithography. In some embodiments, the largest feature formed from lithography is the same as a fully defined feature.

Provided herein are methods and apparatuses for repairing lithographically defined features on a substrate using aspect-ratio dependent deposition and directional etching to maintain critical dimension while reducing local non-uniformity. Some methods involve performing deposition and etching on a lithographically defined (e.g., that which has been developed using lithographic techniques such as optical lithographic techniques including EUV and DUV, or immersion lithography) hard mask having etch selectivity to an underlying etch selectivity. In some embodiments, etch selective layers may increase strain on the film such that films may bend the wafer; as a result, in some embodiments, such limitations may limit the materials that may be used for certain disclosed embodiments.

In various embodiments, methods involve selectively depositing a material over the lithographically defined photoresist or hard mask where the material has a different molecular structure than the photoresist or hard mask. For example, in some embodiments, the lithographically defined photoresist is spin-on carbon, while material deposited over the photoresist includes carbon deposited by plasma-enhanced chemical vapor deposition (PECVD). In various embodiments, the material deposited is deposited thermally. In various embodiments, the material is deposited using plasma. In various embodiments, the material is deposited using a non-conformal deposition technique. For example, the material may not be deposited by atomic layer deposition. Conformal deposition is unlikely to selectively deposit more material on the field region than in the features to even out the feature sizes when the etching is performed to maintain the critical dimension of features across a wafer.

Disclosed embodiments involve atomic layer etch and selective materials deposition to improve pattern fidelity and reduce defect density of photoresist (PR) structures which would be ultimately transferred to a target layer. In advanced EUV lithography, both photoresist pattern fidelity and defect density are degraded by stochastics-related (photon shot noise, materials non-homogeneity) problems.

Certain disclosed embodiments allow defect reduction during the pattern transfer operations, which will invariably lead to improved electrical circuit yield. This reduction in defect density is achieved simultaneously with improved line-edge or line-width roughness, which are critical factors to circuit function (and yield).

Methods involve cyclic etching such as ALE and deposition to etch and mend features of a photoresist or hard mask material such as carbon-containing material. Example carbon-containing material that may be etched and/or mended using disclosed embodiments include photoresists and amorphous carbon. Methods involve a deposition process that is dependent on aspect ratio. For example, deposition may be performed by chemical vapor deposition or plasma enhanced chemical vapor deposition. Deposition is not performed using atomic layer deposition or plasma enhanced atomic layer deposition as such deposition is conformal and independent of aspect ratio. In some embodiments, deposition is performed using a plasma-assisted process, such as plasma enhanced chemical vapor deposition. In various embodiments, disclosed embodiments do not deposit carbon-containing film on an underlayer of the substrate. For example, in some embodiments, selective deposition involves depositing material on the lithographically defined photoresist or hard mask selective to an adjacent underlayer under the hard mask, and while the hard mask may include features such that the bottoms of the features include exposed adjacent underlayer surfaces, the selective deposition deposits selectively on the lithographically defined photoresist or hard mask material relative to the adjacent underlayer surface. In some embodiments, the deposition process deposits a film having a material that has a slower etch rate than photoresist when exposed to certain etching processes. Selectivity as used herein is defined as depositing more material on one region than on another region of the substrate. In some embodiments, the terms "selective" and "preferential" may be used interchangeably, both to mean that more material is deposited on one region than in another region. In various embodiments, selective deposition is achieved whereby more film is deposited on the field regions of a photoresist or carbon-containing material than on sidewalls of the photoresist or carbon-containing material.

ALE is a technique that removes thin layers of material using sequential self-limiting reactions. Generally, ALE may be performed using any suitable technique. Examples of atomic layer etch techniques are described in U.S. Pat. No. 8,883,028, issued on Nov. 11, 2014; U.S. Pat. No. 8,808,561, issued on Aug. 19, 2014; and U.S. Pat. No. 9,576,811, issued on Feb. 21, 2017, which are herein incorporated by reference for purposes of describing example atomic layer etch and etching techniques. In various embodiments, ALE may be performed with plasma, or may be performed thermally.

ALE may be performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas (adsorption), (ii) purging of the reactant gas from the chamber, (iii) delivery of a removal gas and an optional plasma (desorption), and (iv) purging of the chamber.

In some embodiments, super-saturated ALE may be performed. In super-saturated ALE, the delivery of a reactant gas for adsorbing onto and/or modifying the surface of the substrate is performed for a duration longer than the duration sufficient to fully adsorb or modify the substrate surface. In some embodiments, the duration is at least 1.5 times or at least 2 times or at least 5 times longer than the duration sufficient to adsorb at least 80% or modify at least 80% of the substrate surface. For super-saturated ALE of carbon deposited by PECVD, the substrate may be exposed to an oxygen-containing modification gas for a duration of at least about 1 second. It will be understood that the exposure duration sufficient for super-saturated ALE depends on a variety of factors, including material being modified or adsorbed on, the reactant gas used to adsorb or modify the substrate, the process conditions such as temperature and pressure, and the topography of the substrate itself including depth, size, and number of features on a substrate.

Figure 2:
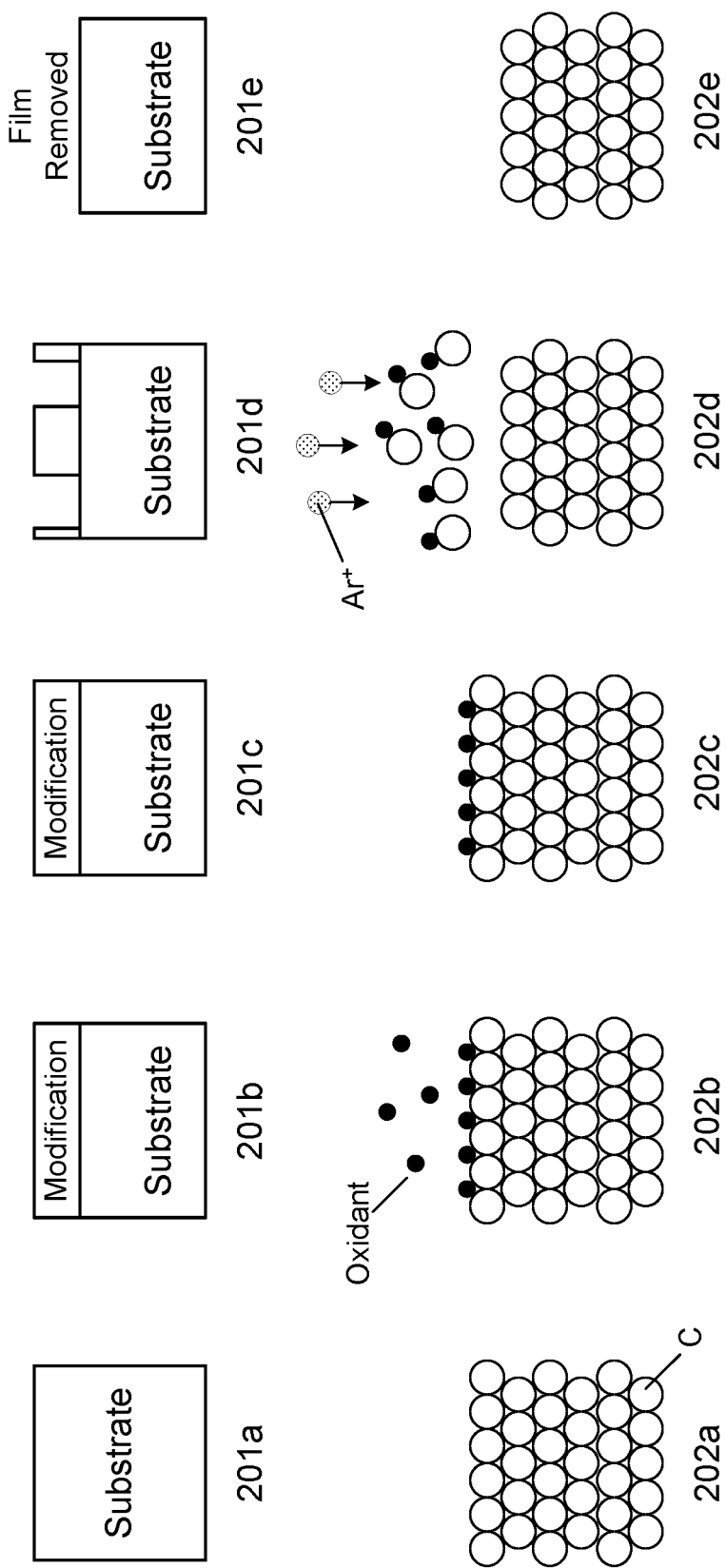
FIG. 2 is a schematic illustration of an example of atomic layer etching of film on a substrate.

FIG. 2 shows two example schematic illustrations of an ALE cycle and a schematic illustration of selective polymer deposition. Diagrams 201a-201e show an example ALE cycle. In 201a, the substrate is provided.

In various embodiments, the substrate may be a silicon wafer, e.g., a 200-mm wafer, a 300-mm wafer, or a 450-mm wafer, including wafers having one or more layers of material, such as dielectric, conducting, or semi-conducting material deposited thereon. In some embodiments, the substrate includes a blanket layer of silicon, such as amorphous silicon, or a blanket layer of germanium. In some embodiments, the substrate surface includes a photoresist, or graphene, or amorphous carbon.

In some embodiments, the layers on the substrate may be patterned. Substrates may have "features" such as via or contact holes, which may be characterized by one or more of narrow and/or re-entrant openings, constrictions within the feature, and high aspect ratios. The feature may be formed in one or more of the above described layers. One example of a feature is a hole or via in a semiconductor substrate or a layer on the substrate. Another example is a trench defined by a line or space in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers. In some embodiments, the surface of the substrate may include more than one type of material, such as if the substrate is patterned. The substrate includes at least one material to be etched and smoothened using disclosed embodiments. This material may be any of those described above—metals, dielectrics, semiconductor materials, and others. In various embodiments, these materials may be prepared for fabricating contacts, vias, gates, etc. In some embodiments, the material to be etched is a hard mask material, such as amorphous carbon. Further example materials include aluminum gallium nitride, silicon, gallium nitride, tungsten, and cobalt.

In various embodiments, the substrate includes a patterned photoresist layer with one or more features formed from EUV or DUV or immersion lithography. Such features are negative features; that is, holes in the patterned photoresist layer.

In 201b, the surface of the substrate is modified. In 201c, the modified layer remains after a purge operation to remove excess non-adsorbed precursor. In 201d, the modified layer is being etched. In 201e, the modified layer is removed.

Similarly, diagrams 202a-202e show an example of an ALE cycle for etching a carbon-containing film. In 202a, a substrate including carbon-containing material is provided, which includes many carbon atoms. In various embodiments, the substrate includes a carbon-containing layer such as a photoresist or amorphous carbon layer.

In 202b, an oxidant is introduced to the substrate which modifies the surface of the substrate. The oxidant may be a strong oxidant such as oxygen ($O_2$) or a weak oxidant such as carbon dioxide ($CO_2$). The selection of oxidants may depend on the type of carbon-containing material on the substrate. For example, in some embodiments, a strong oxidant may be an oxidant suitable to etch hard carbon-containing material, such as amorphous carbon or graphene. In another example, in some embodiments, a weak oxidant may be an oxidant suitable for etching photoresists patterned by EUV lithography, DUV lithography, or immersion lithography.

The schematic in 202b shows that some oxidant is adsorbed onto the surface of the substrate as an example. The modification operation forms a thin, reactive surface layer with a thickness that is more easily removed than the un-modified material in the subsequent removal operation. For etching a carbon-containing material, an oxygen-containing plasma may be used during the modification or adsorption operation. Oxygen-containing plasma may be generated by flowing an oxygen-containing modification chemistry such as oxygen ($O_2$) or a weak oxidant such as carbon dioxide ($CO_2$) and igniting a plasma. Additional weak oxidants include carbon monoxide (CO), nitrogen oxide (NO), and sulfur dioxide ($SO_2$). Additional reactants may include nitrogen, hydrogen, and ammonia compounds and species which can be reactively bound to the resist surface and subsequently volatized using a sub-sputter threshold ion bombardment. These strong and weak oxidants may be used by themselves or in combination, including with diluent inert gases such as helium (He), argon (Ar), neon (Ne), krypton (Kr), xenon (Xe), and combinations thereof. This operation modifies a few angstroms of the carbon-containing material surface to form a modified layer having weaker bond energies than bulk carbon-containing material. In various embodiments, the weak oxidant is provided to the substrate as a plasma with no or a low bias. For example, in various embodiments, the weak oxidant is introduced to a plasma processing chamber and a plasma source power is turned on to ignite a plasma to facilitate adsorption of the weak oxidant onto the surface of the carbon-containing material. The bias may be applied at a low power or voltage, such as a self-bias between about 5V and about 15V or up to about 50V. The plasma power may be set at a power between about 15 W and about 300 W. It will be understood that the terms "bias power" and "bias voltage" are used interchangeably herein to describe the voltage for which a pedestal is set when a bias is applied to the pedestal. Bias power or bias voltage as described herein is measured in volts, which are indicated by the unit "V" or "Vb", where b refers to bias.

In 202c, the weak oxidant is purged from the chamber. In 202d, a removal gas argon is introduced with a directional plasma as indicated by the Ar+ plasma species and arrows, and ion bombardment is performed to remove the modified carbon surface of the substrate. During this operation, a bias is applied to the substrate to attract ions toward it. In the desorption operation, an inert gas plasma (such as He, Ar, Xe, or $N_2$) may be used to remove the modified layer. Although argon is depicted in 202d, it will be understood that any suitable inert gas may be used to generate a plasma for this operation. The bias power applied during removal may be between about 30V and about 100V in various embodiments. The bias power may be selected such that the energy provided to the substrate is less than the energy required to sputter the substrate but greater than the energy used to remove the modified layer from the substrate. The plasma power may be set at a power between about 30 W and about 500 W.

In 202e, the chamber is purged and the byproducts are removed. In various embodiments, between about 1 Å and about 130 Å of material may be removed in one cycle. If a stronger oxidant is used, the etch rate may be greater than if a weaker oxidant is used. For example, for a strong oxidant such as oxygen ($O_2$) and the inert plasma gas may be Ar, and about 10 Å to about 30 Å of resist material may be removed. In some embodiments, if the weak oxidant used is carbon dioxide and the inert gas plasma used to remove the modified layer is helium, each cycle may etch between about 2 Å and 3 Å of material. The post etch surface of the carbon-containing material is typically smooth after an ALE process. For example, in some embodiments, the root mean square roughness of the surface after an ALE process may be less than about 0.5 nm (Rrms<0.5 nm).

While the above described process conditions and chemistries may be used in some embodiments, some embodiments may involve different types of photoresists, such as metal-containing chemically amplified resists (CARs) or metal-oxide inorganic materials, and may also include selective deposition on underlayers, such as inorganic materials, metals, dielectrics, metal oxides, and other suitable materials. These different embodiments may utilize a wider range of chemistries or gases, as well as processing conditions such as bias, temperature, pressure, pulsing, etc. Modulating such process conditions allow effective defect mitigation, pattern fidelity improvement, and smoothening of structures.

Figure 3:
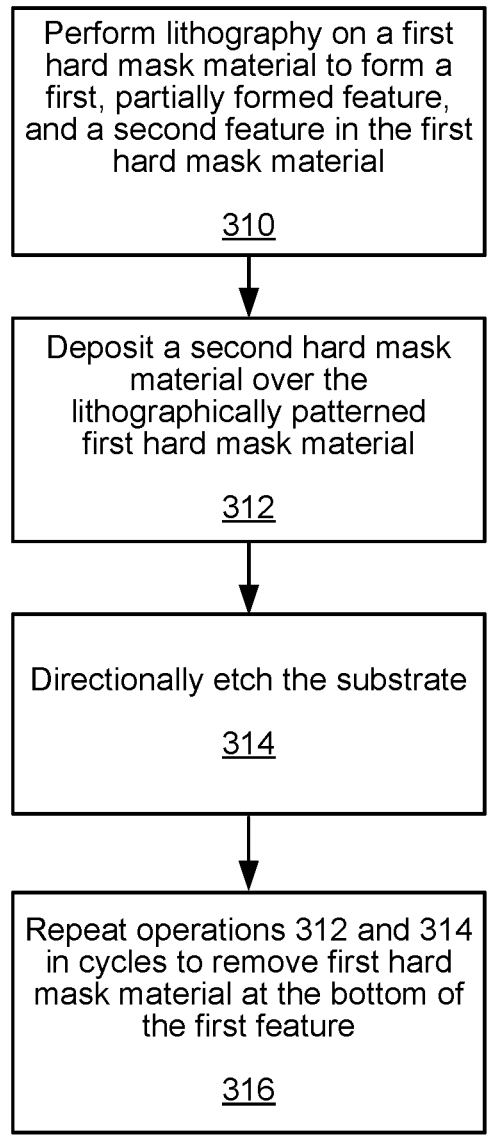
FIG. 3 is a process flow diagram of example operations performed in accordance with disclosed embodiments.

FIG. 3 shows a process flow diagram for performing certain disclosed embodiments. In operation 310, lithography is performed on a first hard mask material to form a first, partially formed feature, and a second feature in the first hard mask material. In various embodiments, the first hard mask is the top most layer of the substrate being processed. In various embodiments, lithography is performed on a substrate having the first hard mask material provided to a process chamber. The first hard mask may be a carbon-containing, silicon-containing, or tin-containing material. In some embodiments, the first hard mask is a carbon-containing material, such as amorphous carbon or spin-on carbon, or may be a photoresist. In some embodiments, the first hard mask is a silicon-containing material, such as amorphous silicon. In some embodiments, the first hard mask is a tin-containing material, such as tin oxide or tin nitride. While the first hard mask material is referred to as a "hard mask material" it will be understood that in many embodiments, the first hard mask material is photoresist.

In various embodiments, the fully formed feature has a feature opening width between about 15 nm and about 100 nm.

In various embodiments, the first hard mask is a photoresist including carbon deposited by spin-on techniques and EUV, DUV, or immersion lithography is performed on the first hard mask.

The first hard mask may be deposited by a spin-on technique. Prior to lithography, the first hard mask may be deposited over one or more layers in a lithography stack. The one or more layers of the lithography stack may include one or more hard masks underlying the first hard mask. In some embodiments, the first hard mask is a photoresist etched using EUV or DUV and is, prior to EUV or DUV, deposited over a substrate having one or more underlying hard masks. In some embodiments, the first hard mask is a layer in a lithography stack.

For example, the layer immediately adjacent to and underlying the first hard mask layer may have the same composition as the first hard mask. This layer is referred to herein as the "adjacent underlayer." The adjacent underlayer may have different composition from the first hard mask. In some embodiments, the layer immediately adjacent to and underlying the first hard mask may both contain carbon but may be deposited by different techniques. In some embodiments, the adjacent underlayer is silicon oxynitride, or silicon-containing anti-reflective coating (SiARC), or spin-on glass, or bottom anti-reflective coating (BARC). In various embodiments, the adjacent underlayer is a tin-containing film, such as tin oxide, or tin nitride, or tin sulfide. In some embodiments the adjacent underlayer includes lead oxide, or lead nitride or lead sulfide, or combinations thereof. Where the adjacent underlayer is tin oxide, less second hard mask material as described below with respect to operation 312 may be deposited in each cycle (which may be performed in the same chamber, or the same tool, or without breaking vacuum) because directional etching can be performed without damaging the tin oxide adjacent underlayer in features that already have a desired depth and/or aspect ratio, thereby achieving etch selectivity while continuing to etch features that are partially defined until such features have the same depth and/or aspect ratio of other features on the substrate, or until variability of depth and/or aspect ratio of features across a wafer is reduced.

The adjacent underlayer may have etch selectivity to the first hardmask when exposed to certain etch chemistries, such as an oxygen-containing gas and/or plasma, or a halogen-containing gas and/or plasma. For example, in some embodiments, the second hard mask material is etched at least 3 times faster than the adjacent underlayer. In some embodiments, the first hard mask material is etched at least 3 times faster than the adjacent under layer. It will be understood that in certain disclosed embodiments, etch rate ratios can be adjusted depending on the etch chemistry and process conditions used, and depending on the materials for the first hard mask, second hard mask, and adjacent underlayer.

Whether the adjacent underlayer has etch selectivity relative to the first hard mask layer has implications for performing directional etching described further below with respect to operation 314. In some embodiments, use of particular etch selective materials for the adjacent underlayer may result in increased stress on the substrate, thus the effect of stress on either the adjacent underlayer or the first hard mask caused by deposition technique used to deposit such films and the thickness of films deposited are weighed against the effect of the etching operations and deposition operations used to mend defects as described herein. Some methods involve a combination of SCD and ALE. In various embodiments, a substrate that has undergone lithographic etching may include partially edged features as well as completely etched features. An example schematic illustration of a substrate that has undergone lithographic etching is depicted in FIG. 1B. In various embodiments, the substrate is lithographically etched or lithographically defined by EUV lithography. In some embodiments, the substrate is lithographically etched or lithographically defined by the DUV lithography.

In operation 312, a second hard mask material is deposited over the first hard mask material in an aspect ratio dependent deposition technique. In some cases, deposition is performed by a mass diffusion technique. For example, in some embodiments, a second hard mask is deposited by plasma enhanced chemical vapor deposition. In many embodiments, the second hard mask is not deposited by a conformal film deposition technique, such as atomic layer deposition, or plasma enhanced atomic layer deposition. Deposition is performed using an aspect ratio dependent deposition technique which may deposit more material in features having larger openings and less material in features having smaller openings. In some embodiments, features are vertical and have sidewalls and bottoms as well as the field region between features on the substrate. In various embodiments, deposition of the second hard mask over such features results in some deposition on sidewalls but mostly deposition at the bottoms and at the field regions of the substrate. In some cases, this is referred to herein as preferentially depositing more second hard mask material on horizontal surfaces of the substrate compared to vertical surfaces of the substrate, such as sidewalls of a feature.

In various embodiments, the second hard mask is the same composition as the first hard mask. In some embodiments, the second hard mask has a different composition from the first hard mask. In some embodiments, both the second hard mask and the first hard mask include carbon-containing material. In some embodiments, the second hard mask and the first hard mask include silicon-containing material. In some embodiments, the second hard mask material is a silicon-containing material, such as silicon dioxide, or silicon nitride. In some embodiments, the second hard mask has a different lattice structure than the first hard mask. For example, in some embodiments, both the second hard mask material and the first hard mask contain carbon, but the first hard mask material is deposited by spin-on techniques resulting in a lattice structure different from PECVD-deposited carbon material for the second hard mask. In some embodiments, the second hard mask and the first hard mask include tin-containing material.

In some embodiments, the second hard mask material is an amorphous carbon material. In some embodiments, the second hard mask material is amorphous carbon doped with any suitable elements from Group III, IV, V, VI, or VII of the Periodic Table of Elements such as oxygen, nitrogen, fluorine, silicon, tin, and combinations thereof. The amorphous carbon may be between about 0.1% and about 50% doped. In some embodiments, small amounts of dopant can change the etch rate and stress of the doped amorphous carbon film. The amount of dopant and the dopants used can be selected to tune the desired etch rate and stress of the second hard mask material.

In various embodiments, the second hard mask and the first hard mask may include the same atoms but in a different molecular structure, such as a different lattice structure. For example, in some embodiments the first hard mask is a spin-on carbon while the second hard mask is a plasma enhanced chemical vapor deposition amorphous carbon.

In some embodiments, the second hard mask is a tin oxide. It will be understood that in some embodiments, the second hard mask is not necessarily a stoichiometric film. For example, in some cases, the film is sub-stoichiometric. For example, a tin-containing oxide film may be tin oxide or stannic oxide, which may include a tin to oxygen atomic ratio between about 0.45 to about 1.05. In some embodiments, the removable film is tin(II) oxide having the chemical structure of SnO. In some embodiments, the removable film is tin(IV) oxide having the chemical structure of $SnO_2$. Examples of suitable tin-containing precursors include halogenated tin-containing precursors (such as tin(II) chloride ($SnCl_4$), and tin(II) bromide ($SnBr_4$)), and non-halogenated tin-containing precursors, such as organotin compounds, which include alkyl-substituted tin amides and the like. Specific examples of alkyl-substituted tin amides that are suitable for ALD include tretrakis(dimethylamino) tin, tretrakis(ethylmethylamino) tin, $N^2,N^3$-di-tert-butyl-butane-2,3-diamino-tin(II) and (1,3-bis(1, 1-dimethylethyl)-4,5-dimethyl-(4R, 5R)-1,3,2-diazastannolidin-2-ylidine. Oxygen-containing reactants include but are not limited to oxygen ($O_2$), ozone ($O_3$), water ($H_2O$), hydrogen peroxide ($H_2O_2$), and nitric oxide (NO).

The second hard mask material may be deposited by any suitable technique for depositing aspect ratio dependent deposition. For example, in PECVD, the second hard mask material may be deposited by exposing the first hard mask material to a carbon-containing precursor and a reducing agent to deposit carbon. For example, one example carbon-containing precursor is methane.

In some embodiments, the second hard mask material may be a silicon-containing material such as, silicon oxide, silicon nitride, or another silicon-containing material. In various embodiments, such films may be deposited using a silicon-containing precursor. For example, in one example, PECVD of silicon oxide material may be performed by using a silicon-containing precursor, such as silicon chloride, or any other suitable silane, including silane, disilane, alkylsilane, chlorosilanes, bromosilanes, and iodosilanes.

"Silicon oxide" is referred to herein as including any and all stoichiometric possibilities for $Si_xO_y$, including integer values of x and y and non-integer values of x and y. For example, "silicon oxide" includes compounds having the formula $SiO_n$, where 1≤n≤2, where n can be an integer or non-integer values. "Silicon oxide" can include sub-stoichiometric compounds such as $SiO_{1.8}$. "Silicon oxide" also includes silicon dioxide ($SiO_2$) and silicon monoxide (SiO). "Silicon oxide" also includes both natural and synthetic variations and also includes any and all crystalline and molecular structures, including tetrahedral coordination of oxygen atoms surrounding a central silicon atom. "Silicon oxide" also includes amorphous silicon oxide and silicates.

Figure 4A:
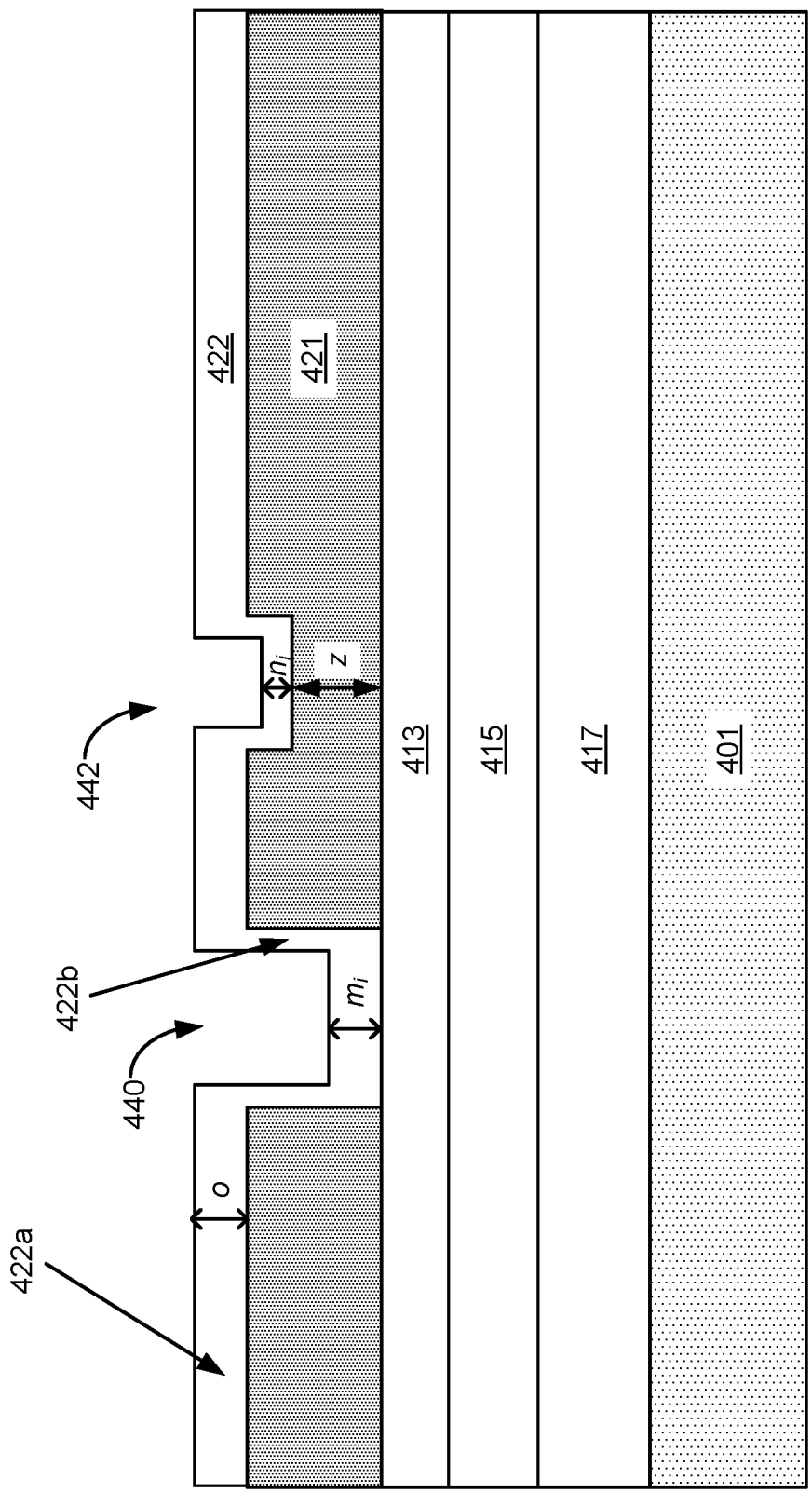
FIG. 4A-4E are schematic illustrations of substrates at various stages of performing certain disclosed embodiments.

FIGS. 4A through 4D are schematic illustrations of example substrates undergoing various operations described herein. In FIG. 4A, a substrate such as that shown in FIG. 1B is provided. The substrate includes a first hard mask material 421, which is lithographically defined to form a second feature 440 and a first feature 442. The lithographically patterned first hard mask material 431 may be over one or more layers, including adjacent underlayer 413, underlayer 415, underlayer 417, and target layer 419.

In this example, second feature 440 is a completely defined feature having the desired aspect ratio and critical dimension. In some embodiments, second feature 440 has a feature opening width between about 15 nm and about 100 nm.

First feature 442 is a partially defined feature that, due to the lithographic technique and stochastic effects, is insufficiently etched as having an aspect ratio and/or a depth less than the desired aspect ratio and/or depth. In various embodiments, the first feature 442 includes first hard mask material at the bottom of the first feature 442. It will be understood that a substrate may include many features, each of which may have various depths, aspect ratios, and critical dimensions, and some of which are completely defined as shown in second feature 440. It will also be understood that completely defined features may be adjacent to or not adjacent to other completely defined features. In some embodiments, the presence of defective features across a substrate may be random.

Prior to deposition or etching, and after lithographically defining features on the first hard mask material 421, the aspect ratio of the first feature 442 may be within about 1% to about 10% of the aspect ratio of the second feature 440. In some embodiments, prior to deposition or etching, and after lithographically defining features on the first hard mask material 421, the critical dimension of the first feature 442 is within about 0.5% to about 1% of the critical dimension of the second feature 440.

Aspect ratio dependent deposition such as PECVD is performed in which a second hard mask material 422, such as a carbon-containing (C) material, is deposited on the photoresist pattern such that thickness (depicted at arrow 422a) on top of the field surface (labeled thickness o) of the first hard mask material 421 (such as a photoresist pattern) is higher than the deposited second hard mask material 422 thickness (depicted at arrow 422b) on the sidewall. In some embodiments, a film that has undergone operation 312 of FIG. 3 results in a structure similar to that of FIG. 4A. In various embodiments, the second hard mask material 422 is a carbon hard mask. In various disclosed embodiments, thinner or less second hard mask material 422 labeled thickness $n_i$ is deposited in the smaller holes such as first feature 442 (due in part to aspect ratio dependent deposition rate) while more or thicker second hard mask material 422 labeled thickness m is deposited in larger holes such as second feature 440. Also, note that under certain process conditions, there is no second hard mask material deposition at the bottom of features (for example, $n_i$ and/or $m_i$ is 0). In various embodiments, the thickness of second hard mask material deposited at the bottom of the features is much thinner than the top (that is, $m_i$ is less than o, and/or $n_i$ is less than o).

In various embodiments, o is between about 2 nm and about 10 nm in thickness after deposition and prior to etching. In various embodiments, $m_i$ may be between about 1 nm and about 5 nm. In various embodiments, $n_i$ may be between about 0 nm and about 2 nm. These example thicknesses are provided as an example for thicknesses if the film were deposited in one cycle, a cycle defined by one operation of operation 312.

As noted above, in some embodiments, for different types of first hard mask materials 421, the processing conditions and gases used for deposition may vary. The deposition process conditions can be tailored such that there is no net deposited second hard mask material thickness at the bottom of a hole, thereby achieving selective or preferential deposition. Etch selectivity may depend on the material deposited, and thus different techniques for depositing the second hard mask material may result in different etch selectivities. The deposition process conditions can be tuned to modulate the etch rate of the deposited second hard mask material relative to first hard mask materials such as organic photoresists as well as other formulations of photoresist materials having photo-sensitivity in EUV and/or DUV wavelength range. In one example, deposition may be performed by exposing the substrate to a carbon-containing chemistry such as methane ($CH_4$) such that carbon material preferentially deposits onto specific surfaces of the substrate. Preferential or selective deposition described herein refers to geometric preference—that is, more deposition on one surface relative to another surface on the same substrate at different areas of the substrate (such as geometric location at the top of or at the bottom of a feature). Although methane is described as an example, other carbon-containing chemistries can be used which may have a chemical formula of $C_xH_y$, where x and y are integers greater than or equal to 1. In some embodiments, preferential deposition of a carbon-containing second hard mask material may be referred to as "selective carbon deposition" or "SCD" as used herein. Selective carbon deposition may be performed with low bias (e.g., self-bias power=about 5V to about 15V) and low RF plasma power in the range of about 30 W to about 500 W. In some embodiments, the carbon-containing chemistry may be combined with one or more diluents to generate a plasma. Example diluents include nitrogen, helium, argon, hydrogen, and combinations thereof.

Returning to FIG. 3, in operation 314, the substrate is directionally etched. In some embodiments, the second hard mask material is etched during operation 314. During etch, in some embodiments, the second hard mask material protects field regions of the first hard mask material. In various embodiments, directionally etching may be performed using ALE. In various embodiments, a bias is applied to allow etching to be performed directionally. As described above, one cycle of ALE involves adsorption of a modification gas to modify a surface of the substrate, followed by exposure to a removal gas to remove the modified surface. In some embodiments, the chamber is purged between modification and removal. In some embodiments, a plasma is ignited during at least one of the modification and the removal operations. In various embodiments, one instance of operation 314 involves performing one cycle of ALE. In various embodiments, one instance of operation 314 involves performing more than one cycle of ALE.

As described above, in some embodiments, super-saturated ALE may be performed. For example, if a surface of the substrate can be saturated with the first etchant to modify the substrate surface in about x seconds (such as about 1 second), super-saturated ALE may involve exposing the substrate to the first etchant for a duration of at least 2× (e.g., at least twice the duration sufficient to saturate the surface in ALE), or 3×, or 10×, or more. In various embodiments, ALE is self-limiting; that is, only what is modified is removed in a single cycle. Thus, in some super-saturated ALE processes, about 1 Å to about 10 Å of material may be removed in a single cycle. In some embodiments of non-super-saturated ALE, about 3 Å or less, or about a monolayer of material is removed in a single cycle. In some embodiments, super-saturated ALE can etch between about 5 nm and about 10 nm of material in one cycle.

The modification gas and removal gas chemistries are selected based on the material being etched. In certain disclosed embodiments, since deposition of the second hard mask material forms second hard mask material even at the bottoms of features, and deposition is performed over a first hard mask, for which etching is desired to achieve the same feature depth and aspect ratio as a desired feature depth and aspect ratio, the modification gas and removal gas chemistries are capable of etching both the second hard mask material and the first hard mask material. Etching is performed in an aspect ratio independent method such that ALE is performed equally in all features. Since the deposition was aspect ratio dependent, however, etching the features in an aspect ratio independent technique and performing deposition and etching in cycles in accordance with certain disclosed embodiments results in formation of a substrate having features with reduced size variation and reduced aspect ratio variation such that features become closer and closer to being the same size across the substrate. More specifically, the smallest and largest critical dimensions (e.g., the far tails such as 6σ of the distribution) over a critical dimension distribution of a substrate are modified such that the spread of the distribution is significantly reduced or eliminated.

Figure 4B:
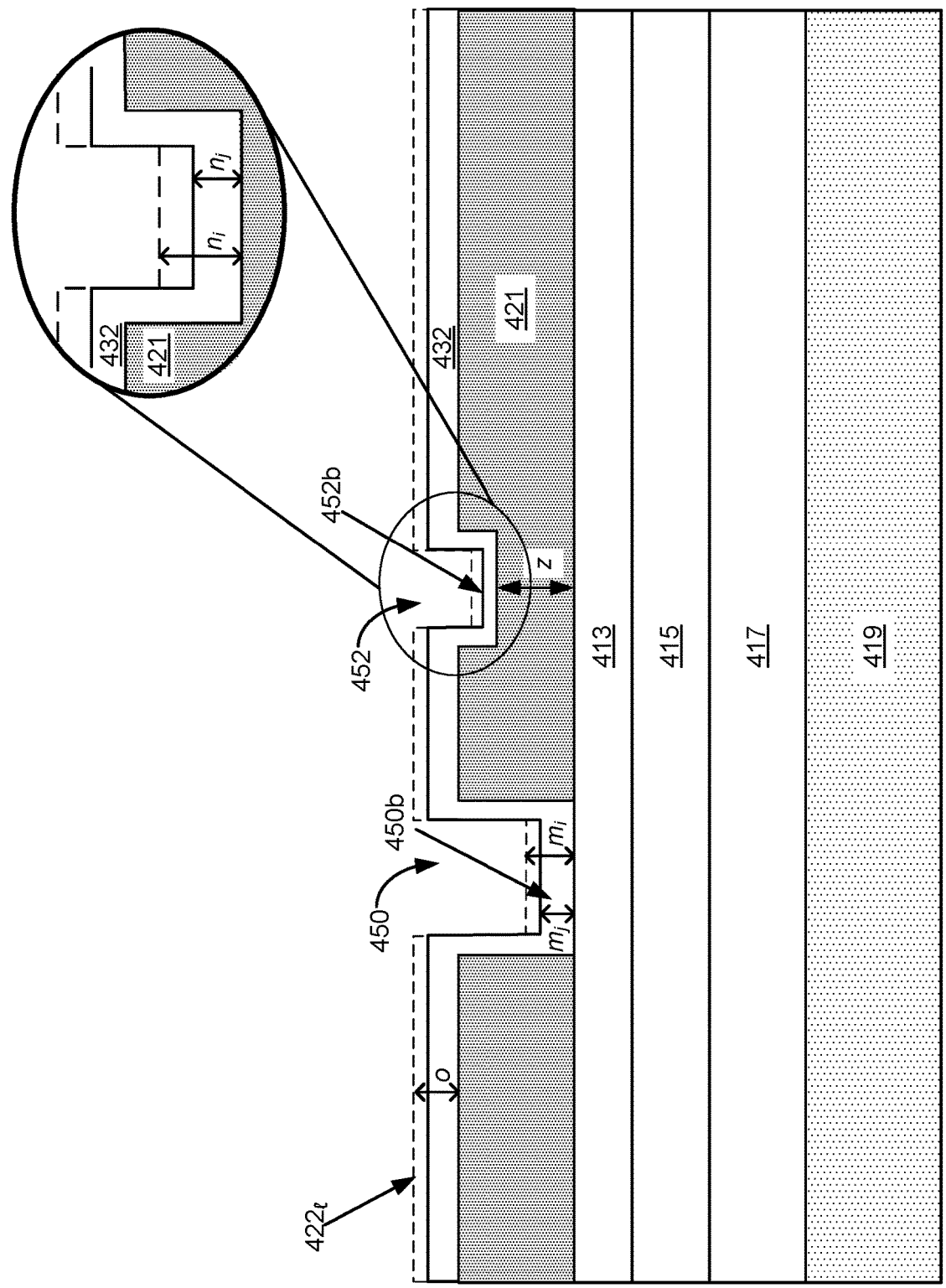
Figure 4C:
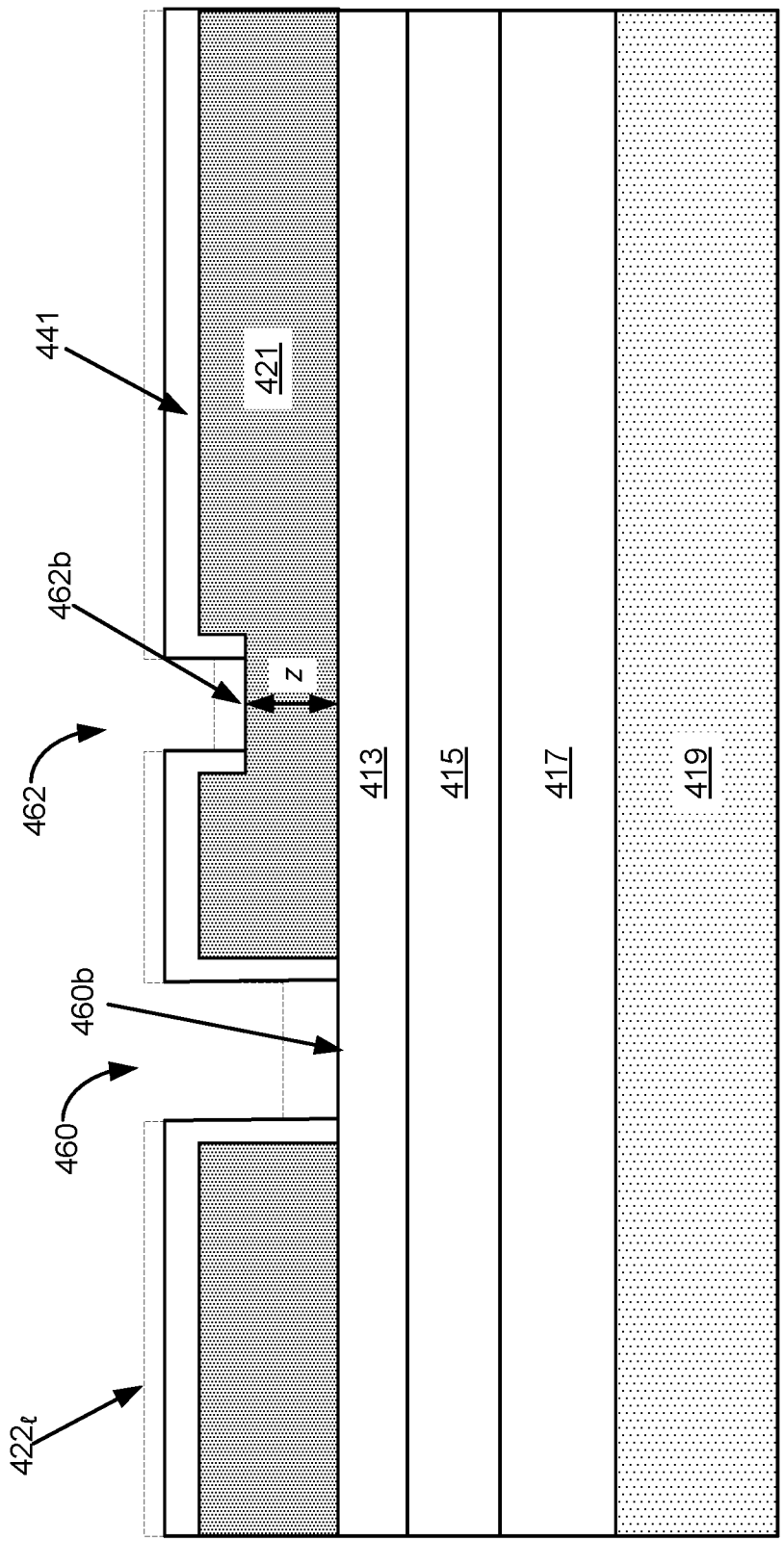
Figure 4D:
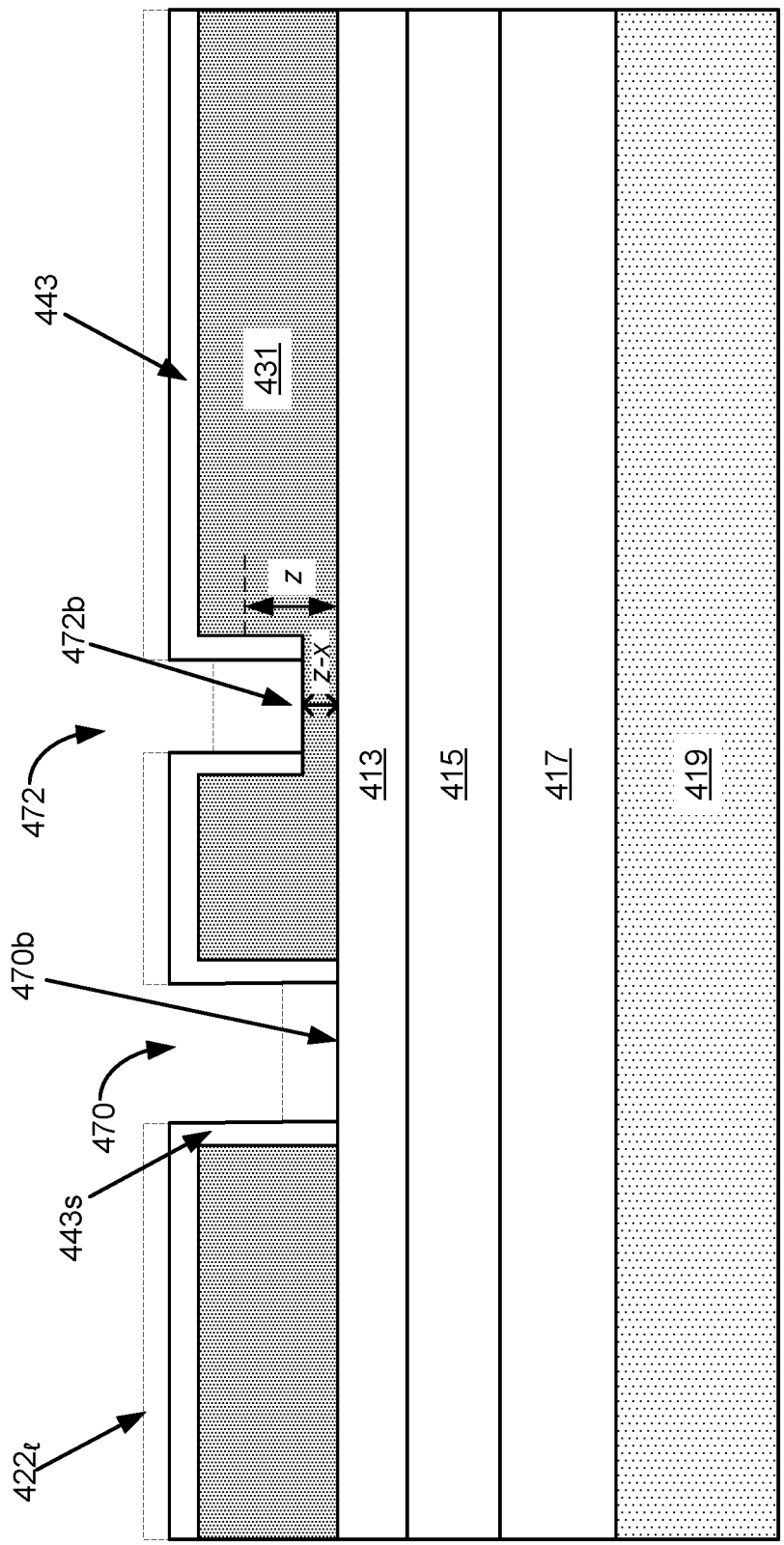

FIG. 4B through 4D show example substrates undergoing operations of certain disclosed embodiments. FIG. 4B shows a substrate having the target layer 419, underlayer 417, underlayer 415, adjacent underlayer 413, patterned first hard mask layer 421, and second hard mask material 432, which has been directionally etched by ALE. In various embodiments, this is an example of a substrate having undergone operation 314 of FIG. 3. The dotted line $422_i$ depicts the thickness o of the second hard mask layer 432 prior to etching, while the second hard mask layer 432 depicted in solid lines shows the thickness of the second hard mask material 432 after etching by ALE. The thickness $m_i$ of the film at the bottom 450b of the second feature 450 is the thickness at the bottom 450b of second feature 450 prior to ALE, while thickness $m_1$ of the film at the bottom 452b of the second feature 450 is the thickness after performing ALE. Likewise, the thickness $n_i$ of the film at the bottom 452b of the first feature 452 is the thickness prior to ALE, while the thickness $n_j$ is the thickness after ALE. It will be understood that in various embodiments, $m_i$–$m_j$ is approximately equal to $n_i$–$n_j$.

In various embodiments, $m_j$ may be between about 0.1 nm and about 0.5 nm less than the thickness prior to one cycle after one cycle of deposition and etching. In various embodiments, $n_j$ may be between about 0 nm and about 0.2 nm less than the thickness prior to one cycle after one cycle of deposition and etching.

As shown in the example, since the second feature 450 is larger (by both aspect ratio and feature width or critical dimension) than first feature 452, etching using an aspect ratio independent etching technique such as ALE removes the same thickness of material at the bottoms of both second feature 450 and first feature 452. Over the course of cycles of deposition and etching, however, the thickness of the second feature 450 is greater than the thickness in first feature 452, such that eventually, the second hard mask material 432 at the bottom 452b of first feature 452 will be completely removed, and each cycle of etching and deposition therefore etches the first hard mask material 421, reducing the thickness z to approaching 0.

Returning to FIG. 3, in operation 316, operations 312 and 314 are repeated in cycles to eventually remove the first hard mask material underlying the second hard mask material in the first feature and thereby reduce the variation in feature size, including aspect ratio and/or feature depth and/or critical dimension. In various embodiments, operations 312 and 314 are performed in the same tool, or in the same chamber, or without breaking vacuum. In various embodiments, repeated operations of operations 312 and 314 result in some embodiments where during operation 314, the material on the substrate being etched is first hard mask material in the first feature. In some embodiments, operations 312 and 314 are repeated until the average critical dimension of the first and second features is at least about 15 nm. In some embodiments, operations 312 and 314 are repeated until the difference between the critical dimension of the first and second features is less than 1 Å. In some embodiments, operations 312 and 314 are repeated in cycles to remove the first hard mask material at the bottom of the first feature to expose the adjacent underlayer. In some embodiments, operations 312 and 314 are repeated in cycles until all features on the first hard mask material are etched through the thickness of the first hard mask material.

One cycle involves deposition of a second hard mask material and one operation of directional etching. In some embodiments, one cycle involves deposition of a second hard mask material and one cycle of ALE. That is, one cycle of repeating operations 312 and 314 involves the following operations: exposure of the substrate to a second hard mask material precursor and reactant, exposure of the substrate to a modification gas for a duration at least sufficient to fully adsorb onto exposed surfaces the substrate, and exposure of the substrate to a removal gas. In another example, one cycle of repeating operations 312 and 314 involves the following operations: exposure of the substrate to a second hard mask material precursor and reactant, exposure of the substrate to a modification gas for a duration greater than the duration sufficient to fully adsorb onto exposed surfaces the substrate, and exposure of the substrate to a removal gas. In another example, one cycle of repeating operations 312 and 314 involves the following operations: exposure of the substrate to a second hard mask material precursor and reactant, exposure of the substrate to a modification gas for a duration at least sufficient to fully adsorb onto exposed surfaces the substrate, purging a chamber housing the substrate, exposure of the substrate to a removal gas, and purging the chamber. In another example, one cycle of repeating operations 312 and 314 involves the following operations: exposure of the substrate to a second hard mask material precursor and reactant, urging a chamber housing the substrate, exposure of the substrate to a modification gas for a duration greater than the duration sufficient to fully adsorb onto exposed surfaces the substrate, exposure of the substrate to a removal gas and purging the chamber. In some embodiments, a plasma is ignited during at least one of the exposure to the modification gas and exposure to the removal gas.

In one example, one cycle of repeating operations 312 and 314 involves the following operations: exposure of the substrate to methane to deposit a carbon-containing film in an aspect ratio dependent manner such as PECVD, exposure of the substrate to an oxygen-containing modification gas for a duration greater than the duration sufficient to fully adsorb onto exposed surfaces the substrate, and exposure of the substrate to a removal gas.

FIG. 4C shows an example of a substrate having undergone one or more cycles of certain disclosed embodiments. The dotted line $422_i$ shows the thickness of the second hard mask material from FIG. 4A prior to etching. As compared to FIG. 4B, second hard mask material 442 has been etched such that there is no second hard mask material 442 at the bottom 460b of second feature 460, and likewise no second hard mask material 442 at the bottom 462b of first feature 462. In some embodiments, there may still be some second hard mask material 442 at the bottom of second feature 460 when there is no second hard mask material at the bottom of first feature 462. In this example, the first hard mask material 421 has not yet been etched, as the difference in feature depth between second feature 460 and first feature 462 is still z.

FIG. 4D shows an example of the substrate from FIG. 4C after multiple cycles of deposition and etching such that the first hard mask material 431 is now etched at the bottom 472b of first feature 472. Note that the prior difference in thickness between second feature 470 and first feature 472 indicated by z has been reduced by x, resulting in a difference in thickness between second feature 470 and first feature 472 z-x. As multiple cycles of deposition and etching are performed, x approaches z such that z approaches 0, therefore reducing the variation in feature depth, and the feature depth of first feature 472 approaches the feature depth of second feature 470. As shown, there is still some thickness of the second hard mask material 443 on the field regions of the substrate. While the schematic illustration shows some second hard mask material 443 on the sidewalls of second feature 470 and first feature 472, it will be understood that in some embodiments, second hard mask material 443 on the sidewalls may also be etched. In some embodiments, etching without using a bias is more likely to etch the second hard mask material 443 on the sidewalls 443s. In some embodiments, some remaining second hard mask material 443 on the sidewalls 443s may be tolerable so long as the first feature 472 is sufficiently etched to the same feature depth as second hard mask 443. In various embodiments, process conditions and deposition and etching may be modulated to tune the profile of the first feature 472 and second feature 470 such that the aspect ratios of the first feature 472 approaches the aspect ratio of second feature 470. For example, a combination of both deposition and etching cycles where etching involves applying a bias and deposition and etching cycles where etching does not involve applying a bias can be used to both etch the first feature 472 to the desired depth while also trimming the sidewalls of the first feature 472 such that repeated cycles and an overall combination of such cycles etches the first feature 472 to have an aspect ratio similar to that of second feature 470.

Repeated cycles of deposition and etching will not etch adjacent underlayer 413, as deposition in each cycle allows formation of thicker second hard mask material in second feature 470 than in first feature 472, and subsequent directional etching that etches the same amount in both second feature 470 and first feature 472 due to aspect ratio independent etching therefore etches the second hard mask material in the second feature 470, while etching some second hard mask material but also first hard mask material in first feature 472. In some embodiments, adjacent underlayer 413 has etch selectivity relative to the first and second hard mask materials, therefore repeated cycles of etching and deposition may not degrade the surface of the adjacent under layer 413 even if there is no second hard mask material on the surface of the bottom of the second feature.

In certain disclosed embodiments, selective deposition of second hard mask material and ALE of the substrate over several cycles may be performed to eventually completely remove first hard mask material from the sidewalls and bottoms of partially defined features to obtain the desired feature specifications and achieve consistent aspect ratio and feature depth for various features across a substrate. That is, cycles of selective deposition and ALE may be performed to such that the difference between the feature depth of a fully defined feature and the feature depth of a partially defined feature approaches 0. In some embodiments, cycles of selective deposition and ALE may be performed to such that the difference between the feature aspect ratio of a fully defined feature and the feature aspect ratio of a partially defined feature approaches 0. Due to an etch rate difference between the deposited carbon-containing material and the photoresist, during ALE, the critical dimension of the smaller hole grows and becomes closer to the bigger hole. Also, the amount of deposited carbon-containing material removal relative to photoresist is precisely controlled during ALE. One characteristic of ALE is the self-limiting rate of material removal which generally results in the etch rate being independent of the structure aspect ratio (height to width ratio).

In this example, the structure of interest, is the lithographically defined hole pattern in the photoresist, whether it is fully cleared (photoresist is developed away) to the bottom or only partially cleared which is considered a defect and therefore undesirable. Process conditions for the ALE operation may vary depending on the type of photoresist. Example process conditions are provided above with respect to FIGS. 2 and 3. In general, the two operations described above (operations 312 and 314 of FIG. 3) are repeated in a cyclic fashion until the smaller (defective) hole is completely cleared from photoresist residue and attains a critical dimension closer to that of the well-defined hole, as shown in FIGS. 4A-4D. Etching conditions during ALE are modulated to achieve a negligible etch rate of the adjacent underlayer (which, as described above, can be either organic such as SiARC or inorganic such as a metal oxide) compared to that of second hard mask material such as SCD carbon-containing material and/or first hard mask material such as photoresist.

Figure 4E:
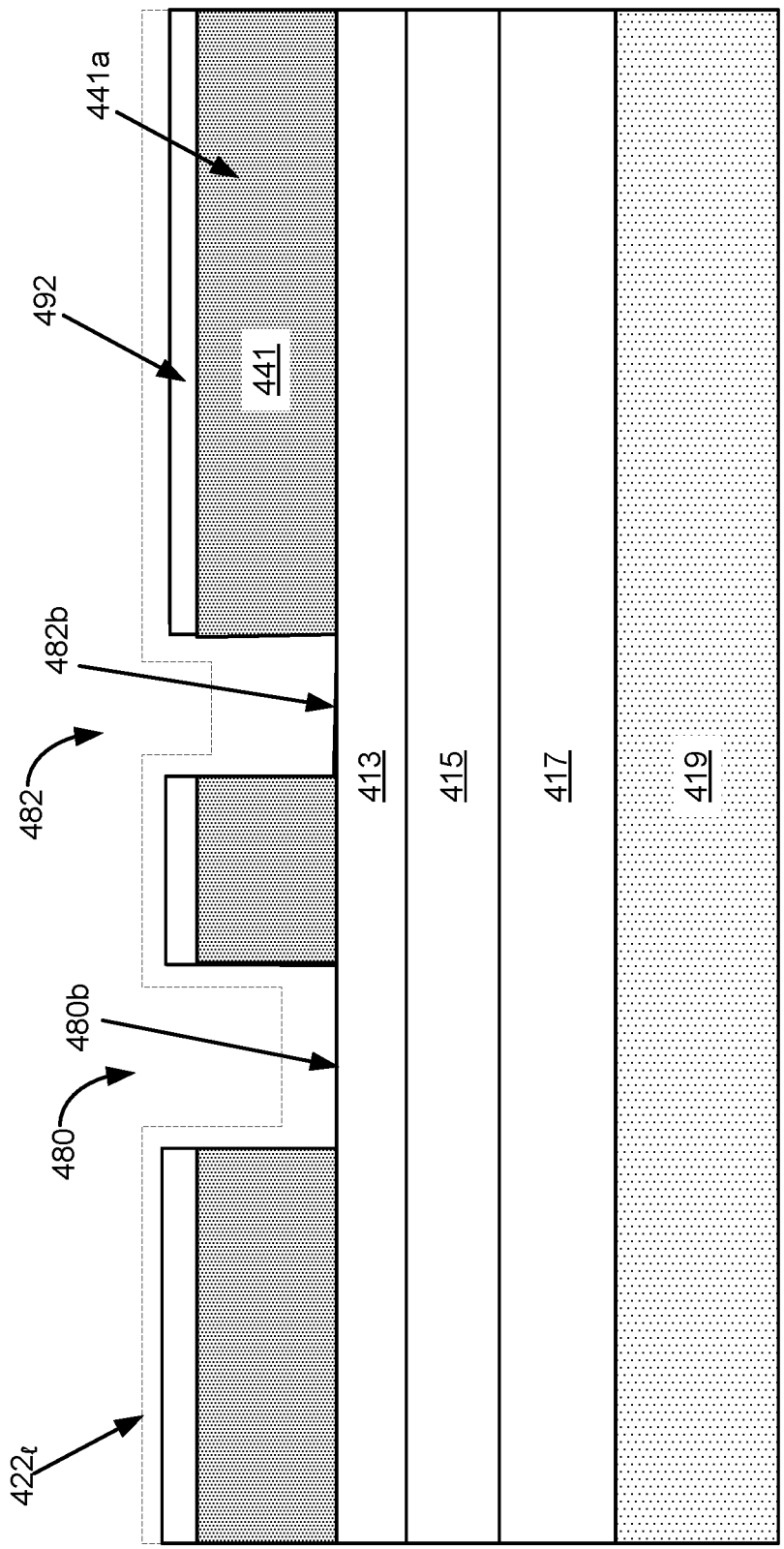

FIG. 4E shows a substrate after various cycles of deposition and etching. The first hard mask material 441 is etched at the bottom 482b of first feature 482 to expose the adjacent underlayer 413. Likewise, the bottom 480b of second feature 480 also exposes the adjacent underlayer 413. The profile of the substrate is compared to the dotted line 4421, which shows the profile of the substrate after deposition of the second hard mask material 492 prior to etching and prior to multiple cycles of deposition and etching.

In various embodiments, cycles of deposition and etching are performed until the average critical dimension of the first and second features is about 25 nm or less or at least about 15 nm. In various embodiments, cycles of deposition and etching are performed until the difference between the critical dimension of the first and second features is less than about 0.2 nm, or within about 1% of each other in an example where the desired feature critical dimension is 20 nm.

As a result, at the conclusion of various cycles of deposition and etching (shown in FIG. 4E), three characteristics for an array of very large number of via holes are observed: first, the critical dimension (CD) of the well-defined via hole (second feature 480) has not significantly changed (either increased or decreased) relative to the incoming lithographic dimension; second, the "undesired" photoresist "residue" (caused by lithography process stochastics) at the bottom 482b of the "defective" via hole (first feature 482) is removed and critical dimension is closer to the target or desired critical dimension; and third, thickness of photoresist or first hard mask material 441 in the unexposed areas (depicted by arrow 441a) (in the case of positive tone lithography) is maintained close to (or slightly more than) the photoresist thickness after completion of the lithography process (prior to any SCD or ALE, but after EUV lithography). The unexposed areas indicated by arrow 441a have similar thickness to the thickness after lithography and prior to deposition and etching cycles as the deposited second hard mask material 492 protects the first hard mask material 441 from being etched during etching performed to remove first hard mask material 441 from the bottom 482b of first feature 482. The resultant final pattern in photoresist is shown in FIG. 4E. Finally the first hard mask material pattern can be transferred into the underlying hard mask stack (413, 415, 417, etc.) and eventually into a target layer 419 by etch processes.

Figure 5:
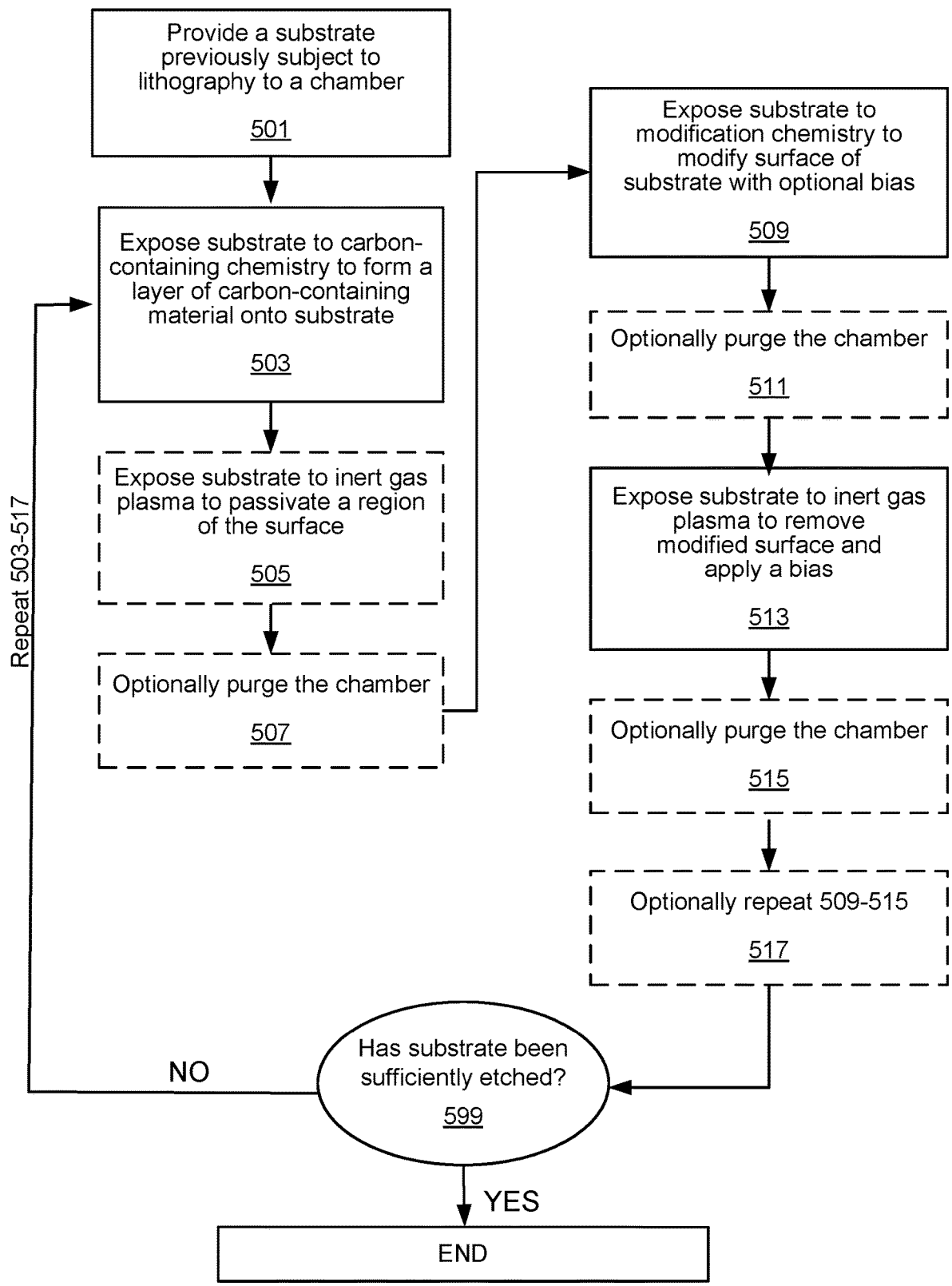
FIG. 5 is a process flow diagram of example operations performed in accordance with disclosed embodiments.

FIG. 5 is a process flow diagram of one example embodiment whereby ALE and SCD are performed in accordance with certain disclosed embodiments. While FIG. 5 refers to deposition of a carbon-containing material and directional etching using atomic layer deposition, it will be understood that disclosed embodiments are not limited to deposition of a carbon-containing material or etching using this described technique. Any other suitable second hard mask material may be used, depending on the first hard mask material subject to lithography, and depending on the adjacent underlayer material. Additionally, other etching methods may be used. For example, in various embodiments, aspect ratio independent etching techniques or another layer-by-layer, self-limiting etching technique may be used.

Referring back to FIG. 5, in some embodiments, operations of FIG. 5 may be performed in a chamber having a chamber pressure between about 5 mTorr and about 100 mTorr. Operations of FIG. 5 may be performed at a substrate temperature between about 0° C. and about 120° C. or between about 20° C. and about 60° C. or between about 0° C. and about 60° C. Substrate temperature will be understood to mean the temperature at which the pedestal or wafer holder which holds the substrate is set at. The operations shown in FIG. 5 summarize example operations that may be performed as described above with respect to FIG. 3. Operations 503-507 may correspond to operation 312 of FIG. 3 and operations 509-515 may correspond to operation 314 of FIG. 3. Operation 310 of FIG. 3 may be performed prior to operation 501 of FIG. 5. In some embodiments, operations 501-599 are performed in the same chamber, or in the same tool, or without breaking vacuum.

In operation 501, a substrate previously subject to lithography is provided to a chamber. In various embodiments, the substrate includes a carbon-containing material. As described above, the carbon-containing material may include a photoresist, or graphene, or amorphous carbon. Operation 501 may correspond with the schematic illustration depicted in 201a and 202a of FIG. 2. The substrate provided in operation 501 includes both partially defined features (such as second feature 142 in FIG. 1B) and fully defined features (such as first feature 140 in FIG. 1B).

In operation 503, the substrate is exposed to a carbon-containing chemistry to form a layer of carbon-containing material onto the substrate. Deposition is performed in an aspect ratio dependent manner. For example, in some embodiments, PECVD is performed using a carbon-containing chemistry to form carbon-containing material over the surfaces of the substrate such that more carbon-containing material is deposited at the bottoms of larger features than at the bottoms of smaller features. This may be used in some embodiments to fill crevices on the carbon-containing surface of the substrate. This operation may correspond to 312 of FIG. 3. In some embodiments, deposition is performed using a plasma and in some embodiments, a bias may be applied. Carbon deposition may be performed with low bias (e.g., self-bias power=about 5V to about 15V) and low RF plasma power in the range of about 30 W to about 500 W. In some embodiments, the carbon-containing chemistry may be combined with one or more diluents to generate a plasma. Example diluents include nitrogen, helium, argon, hydrogen, and combinations thereof.

Operation 505 is optional. In operation 505, the substrate is optionally exposed to an inert gas plasma to passivate regions of the substrate and allow preferential deposition in subsequent cycles such that carbon-containing material is preferentially deposited on horizontal surfaces of the substrate. The inert gas plasma may be generated by flowing any one or more of hydrogen, helium, nitrogen, argon, and neon and igniting a plasma. The plasma may be ignited using a plasma power between about 30 W and about 500 W.

In some embodiments, the chamber may be purged between performing operations 503 and 505. In some embodiments, the substrate may be purged one or more times between performing any of the described operations. In various embodiments, operations 503 and 505 may be optionally repeated in cycles and cycles may be performed with or without purge operations between performing operations 423 and 424.

In operation 507, the chamber may be optionally purged. In some embodiments, purging is performed between operations 503 and 505, or only after operation 503, or only after operation 505. It will be understood that purging operations as described herein may be performed by pumping gases from the chamber, by flowing one or more inert gases, or combinations thereof using any suitable purging technique.

In operation 509, the substrate is exposed to a modification chemistry, such as oxygen-containing gases such as oxygen, $CO_2$, or in some cases, fluorocarbon gases, to modify a surface of the substrate. In some embodiments, the carbon-containing material deposited in operation 503 is modified. In some embodiments, the photoresist underlying the carbon-containing material that was previously subject to lithography is modified. In some embodiments, the material on the substrate surface that is modified is different from feature to feature. For example, in some embodiments, the bottoms of some features include photoresist while the bottoms of other features include carbon-containing material. The material at the bottoms of the features may depend on the aspect ratio of the features, the feature depths, and the number of cycles of deposition and etching that the substrate has been exposed to. In various disclosed embodiments, the carbon-containing material on the surface is modified. This operation may correspond with the schematic illustration depicted in 201b and 202b of FIG. 2. In various embodiments, the substrate is exposed to the modification chemistry for a duration greater than the duration sufficient to modify a monolayer of the substrate. In some embodiments, the modification chemistry is used to super-saturate the surface such that between about 1 to about 5 atomic layers of the material being modified are modified. The modification chemistry may be selected such that it is suitable for modifying both the first hard mask material such as photoresist and the second hard mask material such as carbon-containing material.

In operation 511, the chamber is optionally purged to remove excess modification chemistry (such as a weak oxidant, i.e. $CO_2$) from the chamber. This operation may correspond to 202d of FIG. 2. The chamber may be purged by evacuating the chamber or stopping the flow of the modification chemistry and flowing a non-reactive inert gas, such as helium or argon, to remove the excess gas phase modification chemistry.

In operation 513, the substrate is exposed to a removal chemistry such as an inert gas plasma to remove the modified surface. During operation 407 a bias is applied to generate enough energy for the inert gas plasma to remove the modified surface without sputtering the substrate. In some embodiments, a plasma may not be used. In some embodiments, a bias may not be used. In some embodiments, the plasma alone without the bias is sufficient to remove modified surfaces. The removal chemistry may be selected such that it is suitable for etching both the first hard mask material such as photoresist and the second hard mask material such as carbon-containing material. The removal chemistry may be selected depending on the modification chemistry selected.

In operation 515, the chamber is optionally purged to remove modified material in gas phase from the chamber.

In operation 517, the operations 509-515 may be optionally repeated in cycles. In some embodiments, operation 517 is not performed at all, such that only one cycle of operations 509-515 are performed for every deposition of carbon-containing material in operation 503.

In operation 599, it is determined whether the substrate has been sufficiently etched to form the desired surface on the substrate. If not, operations 503-517 may be optionally repeated for x cycles, where x is an integer equal to or greater than 1. In some embodiments, operations 509-517 are repeated only in some but not all repeated cycles, while in some embodiments, operations 509-517 are repeated in every cycle.

In various embodiments, operations 503-517 may be modulated or varied for a wide range of photoresist and underlayer materials, as well as other types of patterns, such as line-space gratings. For example, the number of repeated cycles or the number of ALE cycles performed for each selected duration of SCD may depend on, in addition to other factors, the material provided on the substrate to be processed, the material to be deposited by SCD, the pattern of the material provided on the substrate to be processed, and the material of the underlayers under the material provided on the substrate to be processed. The gas chemistries, bias power if applied, plasma conditions, temperature, pressure, and other processing conditions may also vary depending on, in addition to other factors, the material provided on the substrate to be processed, the material to be deposited by SCD, the pattern of the material provided on the substrate to be processed, and the material of the underlayers under the material provided on the substrate to be processed.

By combining ALE process and the selective deposition process, photoresist defects are mended. This improvement is then transferred to an underlying hard mask (such as a silicon oxide/silicon nitride ($SiO_2$/SiN) layer), and consequently to structures of interest resulting in improved variability and performance of the devices.

The ALE operations are gentle and precise which removes a digital amount of material per cycle so etching can be easily controlled so as to not overetch the soft resist material. Similarly, the carbon-based selective deposition uses very low source power (e.g., transformer couple plasma or TCP) and no bias, and deposition can be performed without damaging the resist.

In some embodiments, selective carbon deposition may be optional. For example, these certain embodiments may be used in applications where some defects may be tolerated. In some embodiments, other deposition techniques are performed in lieu of selective carbon deposition. For example, in some embodiments, PECVD may be performed, which due to the continuous exposure of reactants and the feature geometry, deposits in an aspect ratio dependent manner for a loading effect such that larger features are deposited with more material while smaller features are deposited with less material.

In certain embodiments, a combination of disclosed ALE operations and carbon deposition may be used on a carbon-containing material to improve local critical dimension uniformity (LCDU) and recover the critical dimension if the original critical dimension is to be maintained throughout a patterning process using a photoresist.

Apparatus

Disclosed embodiments may be performed in any suitable etching chamber or apparatus, such as the Kiyo® FX, available from Lam Research Corporation of Fremont, CA Another example of a plasma etch chamber that may be employed is a Flex™ reactive ion etch tool available from Lam Research Corp. of Fremont, CA Further description of plasma etch chambers may be found in U.S. Pat. Nos. 6,841,943 and 8,552,334, which are herein incorporated by reference in their entireties.

In some embodiments, an inductively coupled plasma (ICP) reactor may be used. One example is provided in FIG. 6. Such ICP reactors have also been described in U.S. Pat. No. 9,362,133 issued Jun. 7, 2016, filed Dec. 10, 2013, and titled "METHOD FOR FORMING A MASK BY ETCHING CONFORMAL FILM ON PATTERNED ASHABLE HARDMASK," hereby incorporated by reference for the purpose of describing a suitable ICP reactor for implementation of the techniques described herein. Although ICP reactors are described herein, in some embodiments, it should be understood that capacitively coupled plasma reactors may also be used. An example etching chamber or apparatus may include a chamber having chamber walls, a chuck for holding a substrate or wafer to be processed which may include electrostatic electrodes for chucking and dechucking a wafer and may be electrically charged using an RF power supply, an RF power supply configured to supply power to a coil to generate a plasma, and gas flow inlets for inletting gases as described herein. For example, modification chemistry gases and/or deposition chemistry may be flowed to the etching chamber for performing ALE and/or deposition respectively. In some embodiments, an apparatus may include more than one chamber, each of which may be used to etch, deposit, or process substrates. The chamber or apparatus may include a system controller for controlling some or all of the operations of the chamber or apparatus such as modulating the chamber pressure, inert gas flow, plasma power, plasma frequency, reactive gas flow (e.g., weak oxidant gas, carbon-containing gas, etc.); bias power, temperature, vacuum settings; and other process conditions. The chamber may also be used to deposit carbon-containing material onto a substrate.

Figure 6:
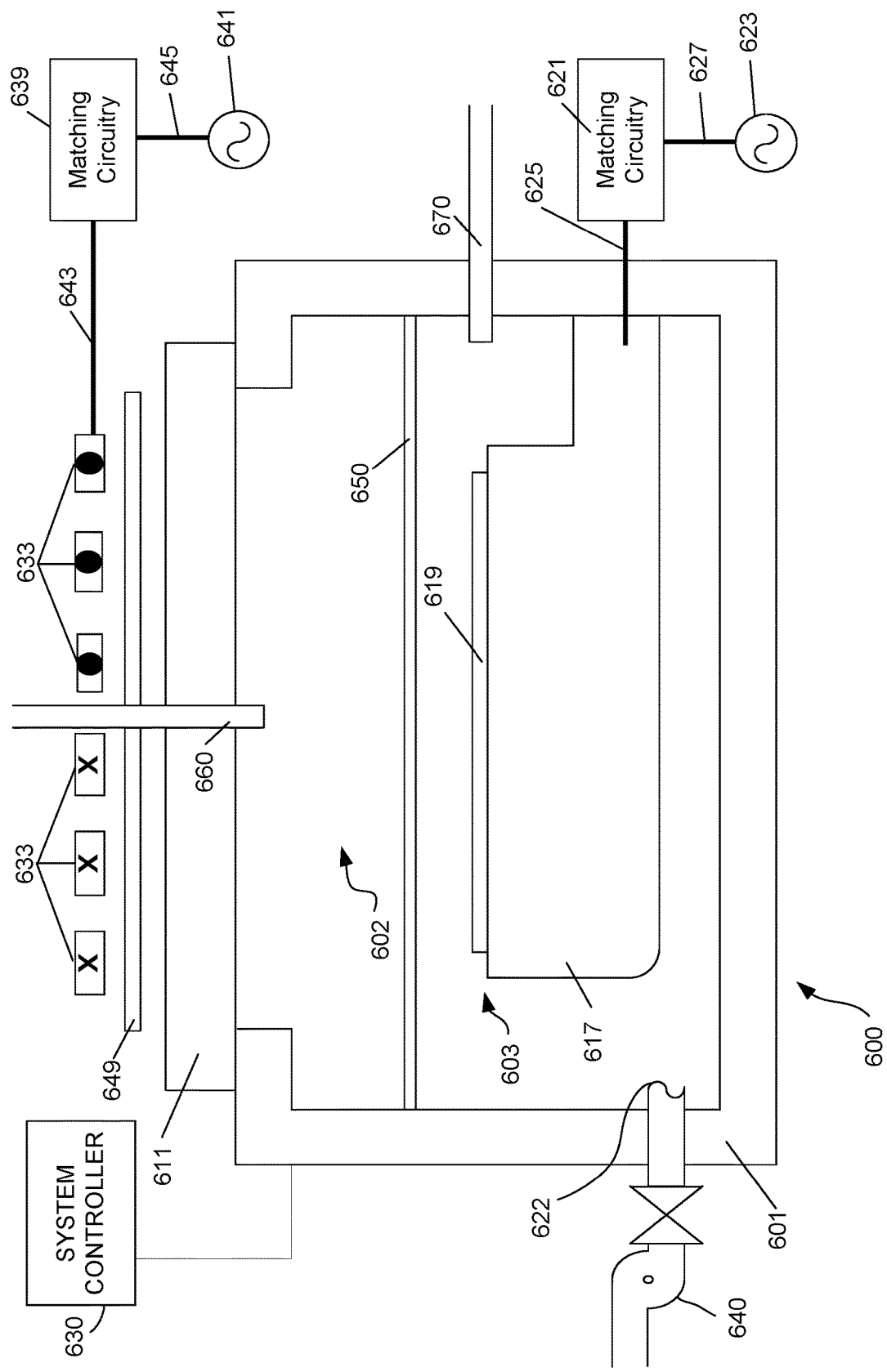
FIG. 6 is a schematic diagram of an example process chamber for performing certain disclosed embodiments.

FIG. 6 schematically shows a cross-sectional view of an inductively coupled plasma integrated etching and deposition apparatus 600 appropriate for implementing certain embodiments herein, an example of which is a Kiyo™ reactor, produced by Lam Research Corp. of Fremont, CA The inductively coupled plasma integrated etching and deposition apparatus 600 includes an chamber 601 structurally defined by chamber walls and a window 611. The chamber walls may be fabricated from stainless steel or aluminum. The window 611 may be fabricated from quartz or other dielectric material. An optional grid 650 divides the chamber 601 into an upper sub-chamber 602 and a lower sub-chamber 603. In most embodiments, plasma grid 650 may be removed, thereby utilizing a chamber space made of sub-chambers 602 and 603. A chuck 617 is positioned within the lower sub-chamber 603 near the bottom inner surface. The chuck 617 is configured to receive and hold a wafer 619 upon which the etching and deposition processes are performed. The chuck 617 can be an electrostatic chuck for supporting the wafer 619 when present. In some embodiments, an edge ring (not shown) surrounds chuck 617, and has an upper surface that is approximately planar with a top surface of a wafer 619, when present over chuck 617. The chuck 617 also includes electrostatic electrodes for chucking and dechucking the wafer. A filter and DC clamp power supply (not shown) may be provided for this purpose. Other control systems for lifting the wafer 619 off the chuck 617 can also be provided. The chuck 617 can be electrically charged using an RF power supply 623. The RF power supply 623 is connected to matching circuitry 621 through a connection 627. The matching circuitry 621 is connected to the chuck 617 through a connection 625. In this manner, the RF power supply 623 is connected to the chuck 617.

Elements for plasma generation include a coil 633 is positioned above window 611. In some embodiments, a coil is not used in disclosed embodiments. The coil 633 is fabricated from an electrically conductive material and includes at least one complete turn. The example of a coil 633 shown in FIG. 6 includes three turns. The cross-sections of coil 633 are shown with symbols, and coils having an "X" extend rotationally into the page, while coils having a "•" extend rotationally out of the page. Elements for plasma generation also include an RF power supply 641 configured to supply RF power to the coil 633. In general, the RF power supply 641 is connected to matching circuitry 639 through a connection 645. The matching circuitry 639 is connected to the coil 633 through a connection 643. In this manner, the RF power supply 641 is connected to the coil 633. An optional Faraday shield 649 is positioned between the coil 633 and the window 611. The Faraday shield 649 is maintained in a spaced apart relationship relative to the coil 633. The Faraday shield 649 is disposed immediately above the window 611. The coil 633, the Faraday shield 649, and the window 611 are each configured to be substantially parallel to one another. The Faraday shield may prevent metal or other species from depositing on the dielectric window of the chamber 601.

Process gases (e.g. oxygen, carbon dioxide, methane, etc.) may be flowed into the chamber 601 through one or more gas flow inlets 660 positioned in the upper sub-chamber 602 and/or through one or more side gas flow inlets 670. Likewise, though not explicitly shown, similar gas flow inlets may be used to supply process gases to a capacitively coupled plasma processing chamber. A vacuum pump, e.g., a one or two stage mechanical dry pump and/or turbomolecular pump 640, may be used to draw process gases out of the chamber 601 and to maintain a pressure within the chamber 601. For example, the pump may be used to evacuate the chamber 601 during a purge operation of ALE. A valve-controlled conduit may be used to fluidically connect the vacuum pump to the chamber 601 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 660 and/or 670. In certain embodiments, process gas may be supplied only through the gas flow inlet 660, or only through the side gas flow inlet 670. In some cases, the gas flow inlets shown in the figure may be replaced with more complex gas flow inlets, one or more showerheads, for example. The Faraday shield 649 and/or optional grid 650 may include internal channels and holes that allow delivery of process gases to the chamber 601. Either or both of Faraday shield 649 and optional grid 650 may serve as a showerhead for delivery of process gases. In some embodiments, a liquid vaporization and delivery system may be situated upstream of the chamber 601, such that once a liquid reactant or precursor is vaporized, the vaporized reactant or precursor is introduced into the chamber 601 via a gas flow inlet 660 and/or 670.

Radio frequency power is supplied from the RF power supply 641 to the coil 633 to cause an RF current to flow through the coil 633. The RF current flowing through the coil 633 generates an electromagnetic field about the coil 633. The electromagnetic field generates an inductive current within the upper sub-chamber 602. The physical and chemical interactions of various generated ions and radicals with the wafer 619 etch features of and deposit layers on the wafer.

If the plasma grid is used such that there is both an upper sub-chamber 602 and a lower sub-chamber 603, the inductive current acts on the gas present in the upper sub-chamber 602 to generate an electron-ion plasma in the upper sub-chamber 602. The optional grid 650 limits the amount of hot electrons in the lower sub-chamber 603. In some embodiments, the apparatus is designed and operated such that the plasma present in the lower sub-chamber 603 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower-sub-chamber 603 through port 622. The chuck 617 disclosed herein may operate at elevated temperatures ranging between about 10° C. and about 250° C. The temperature will depend on the process operation and specific recipe.

Chamber 601 may be coupled to facilities (not shown) when installed in a clean room or a fabrication facility. Facilities include plumbing that provide processing gases, vacuum, temperature control, and environmental particle control. These facilities are coupled to chamber 601, when installed in the target fabrication facility. Additionally, chamber 601 may be coupled to a transfer chamber that allows robotics to transfer semiconductor wafers into and out of chamber 601 using typical automation.

In some embodiments, a controller 630 (which may include one or more physical or logical controllers) controls some or all of the operations of a processing chamber. The controller 630 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 650 ms. Switching time may depend on the flow chemistry, recipe chosen, reactor architecture, and other factors.

The chamber 601 or apparatus may include a system controller. For example, in some embodiments, a controller 630 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 630, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 630 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing operations during the fabrication of one or more layers, materials, metals, oxides, silicon, silicon dioxide, surfaces, circuits, and/or dies of a wafer.

The controller 630, in some implementations, may be a part of or coupled to a computer that is integrated with, coupled to the system, otherwise networked to the system, or a combination thereof. For example, the controller 630 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing operations to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing operations to be performed during one or more operations. It should be understood that the parameters may be specific to the type of process to be performed and the type of tool that the controller is configured to interface with or control. Thus as described above, the controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process operation or operations to be performed by the tool, the controller 630 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 7:
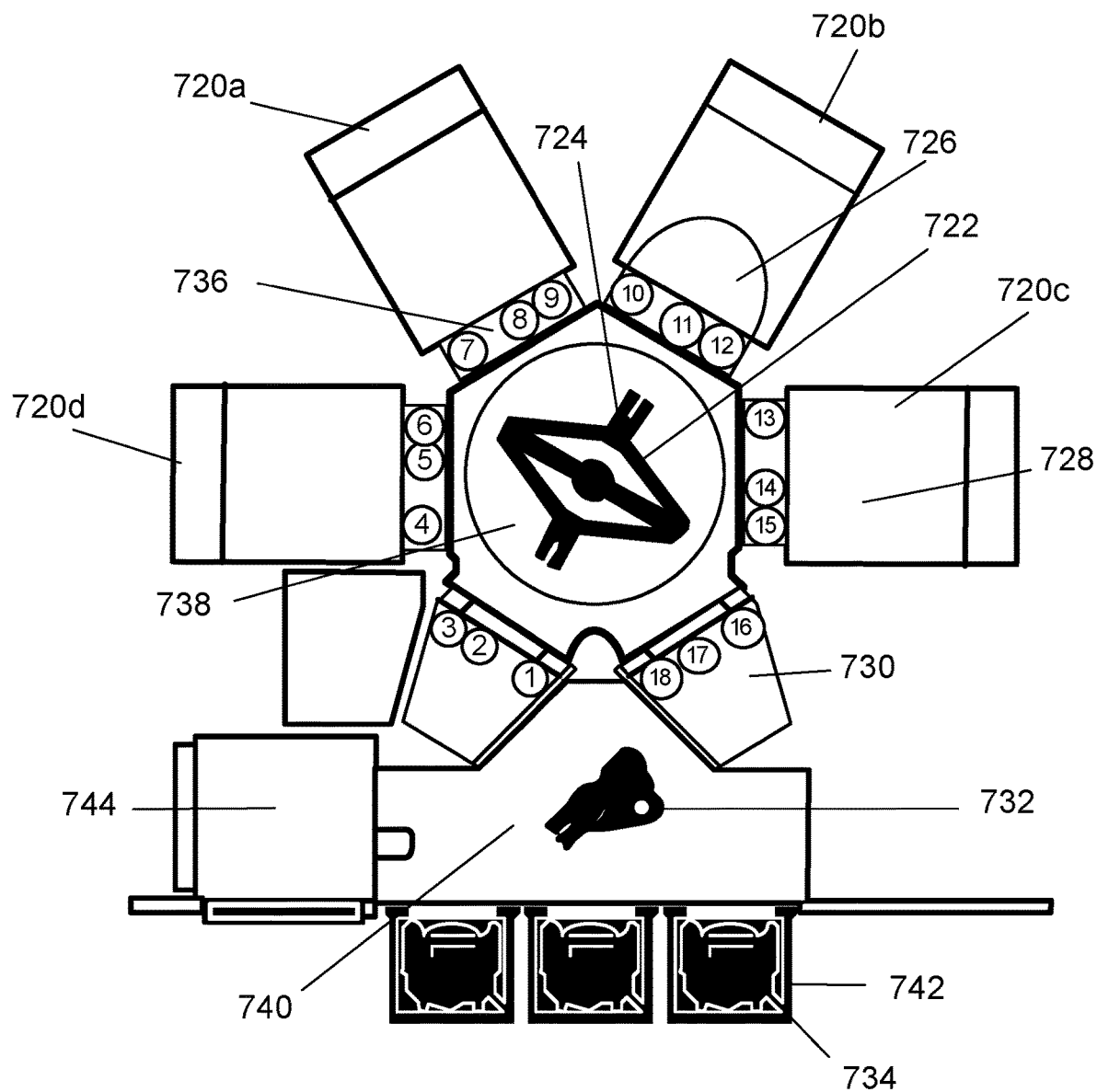
FIG. 7 is a schematic diagram of an example process apparatus for performing certain disclosed embodiments.

The chamber 601 may be integrated in a multi-station tool such as shown in FIG. 7. Each station may be used to process different operations. For example, one station may be used to perform directional etching such as ALE while another station is used to perform deposition. Disclosed embodiments may be performed without breaking vacuum and may be performed in the same apparatus. In various embodiments, directional etching such as ALE and deposition are performed without breaking vacuum. In various embodiments, directional etching such as ALE and deposition are performed in the same chamber.

FIG. 7 depicts a semiconductor process cluster architecture with various modules that interface with a vacuum transfer module 738 (VTM). The arrangement of transfer modules to "transfer" wafers among multiple storage facilities and processing modules may be referred to as a "cluster tool architecture" system. Airlock module 730, also known as a loadlock or transfer module, is shown in VTM 738 with four processing modules 720a-720d, which may be individual optimized to perform various fabrication processes.

By way of example, processing modules 720a-720d may be implemented to perform substrate etching, deposition, ion implantation, wafer cleaning, sputtering, and/or other semiconductor processes. In some embodiments, ALE and deposition are performed in the same module. In some embodiments, ALE and deposition are performed in different modules of the same tool. One or more of the substrate etching processing modules (any of 720a-720d) may be implemented as disclosed herein, i.e., for performing ALE, depositing carbon-containing material, and other suitable functions in accordance with the disclosed embodiments. Airlock module 730 and process module 720 may be referred to as "stations." Each station has a facet 736 that interfaces the station to VTM 738. Inside each facet, sensors 1-18 are used to detect the passing of wafer 726 when moved between respective stations.

Robot 722 transfers wafer 726 between stations. In one embodiment, robot 722 has one arm, and in another embodiment, robot 722 has two arms, where each arm has an end effector 724 to pick wafers such as wafer 726 for transport. Front-end robot 732, in atmospheric transfer module (ATM) 740, is used to transfer wafers 726 from cassette or Front Opening Unified Pod (FOUP) 734 in Load Port Module (LPM) 742 to airlock module 730. Module center 728 inside process module 720 is one location for placing wafer 726. Aligner 744 in ATM 740 is used to align wafers.

In an exemplary processing method, a wafer is placed in one of the FOUPs 734 in the LPM 742. Front-end robot 732 transfers the wafer from the FOUP 734 to an aligner 744, which allows the wafer 726 to be properly centered before it is etched or processed. After being aligned, the wafer 726 is moved by the front-end robot 732 into an airlock module 730. Because airlock modules have the ability to match the environment between an ATM and a VTM, the wafer 726 is able to move between the two pressure environments without being damaged. From the airlock module 730, the wafer 726 is moved by robot 722 through VTM 738 and into one of the process modules 720a-720d. In order to achieve this wafer movement, the robot 722 uses end effectors 724 on each of its arms. Once the wafer 726 has been processed, it is moved by robot 722 from the process modules 720a-720d to an airlock module 730. From here, the wafer 726 may be moved by the front-end robot 732 to one of the FOUPs 734 or to the aligner 744.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 6 may be implemented with the tool in FIG. 7.

Experimental

Figure 8:
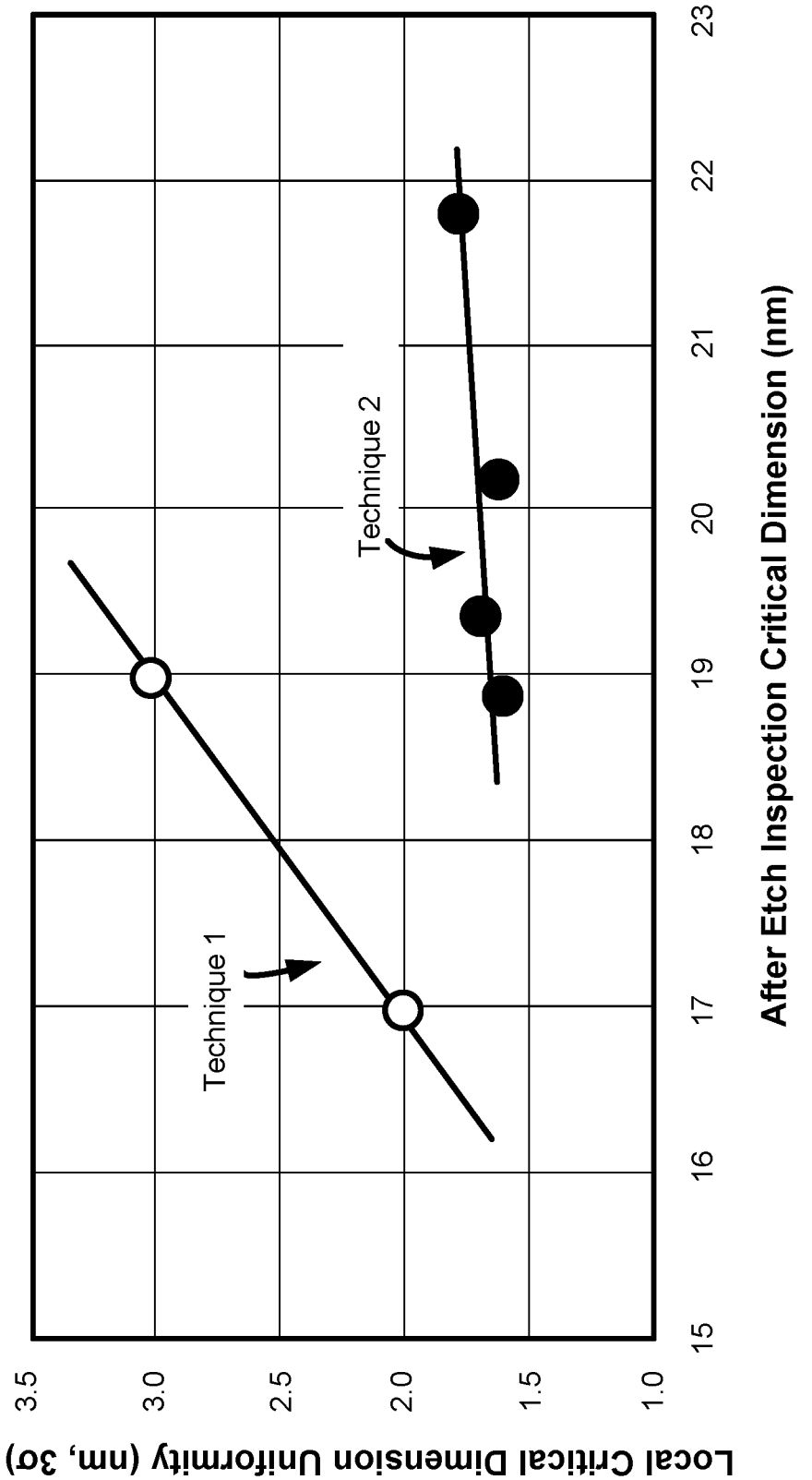
FIG. 8 is a graph of local critical dimension uniformity versus after etch inspection critical dimension for a deposition technique and a technique performed in accordance with certain disclosed embodiments performed in an experiment.

Technique 1 was performed on a substrate previously etched by EUV lithography by depositing material over a pattern, followed by transfer etch to the target film. This process is not a cyclic process. The local critical dimension uniformity (LCDU) reduction is proportional to the critical dimension (CD) reduced, as indicated in FIG. 8 and is not aspect ratio dependent. More trim results in more LCDU reduction. This process can reduce the critical dimension which reduces LCDU but it does not address the distribution of critical dimensions of features from an incoming wafer from lithography, in particular the smaller critical dimension features as deposition may close features and may be difficult to recover these features. Technique 1 grows the CD of the feature, but a pitch limitation can be reached and tightly pitched features will not be lithographically defined as the spaces between two features are too small.

Technique 2 involves using 10 to 15 cycles of deposition of carbon and atomic layer etching on substrates etched by EUV lithography. The incoming critical dimension was about 22 to about 23 nm. The LCDU as indicated is about 1.6 nm as shown in FIG. 8. The LCDU can be reduced to about 1.6 nm while maintaining the CD close to the incoming CD. The critical dimension can also be adjusted down to 19 nm and smaller without risking closed features and without adjusting the lithographic CD. Both the LCDU and CD can be independently controlled by this technique.

Conclusion

Although the foregoing embodiments have been described in some detail for purposes of clarity of understanding, it will be apparent that certain changes and modifications may be practiced within the scope of the disclosure. Further disclosure is provided by way of the appended sample claims, directed towards some particular embodiments, but not intended to be limiting. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. An apparatus for processing semiconductor substrates, the apparatus comprising:
    one or more process chambers, each process chamber comprising a chuck;
    one or more gas inlets into the process chambers and associated flow-control hardware;
    a plasma generator; and
    a controller having at least one processor and a memory, wherein
        the at least one processor and the memory are communicatively connected with one another,
        the at least one processor is at least operatively connected with the flow-control hardware, and
        the memory stores computer-executable instructions for controlling the at least one processor to at least control the flow-control hardware by:
            causing introduction of a hard mask deposition precursor, the hard mask deposition precursor to be flowed to preferentially deposit more material at a bottom of a second feature than at the bottom of a first feature on a substrate;
            after introducing the hard mask deposition precursor, causing stopping of the introduction of the hard mask deposition precursor;
            after stopping the introduction of the hard mask deposition precursor, causing introduction of a modification gas; and
            after introduction of the modification gas, causing introduction of an inert gas and generation of a plasma,
        wherein introduction of the hard mask deposition precursor, modification gas, and inert gas are performed without breaking vacuum.

2. The apparatus of claim 1, wherein the computer-executable instructions further comprises instructions for repeating introduction of the hard mask deposition precursor, modification gas, and inert gas in two or more cycles.

3. The apparatus of claim 1, wherein the computer-executable instructions for causing the introduction of the hard mask deposition precursor comprises instructions for co-flowing a diluent with the hard mask deposition precursor to the one or more process chambers.

4. The apparatus of claim 1, wherein the computer-executable instructions include instructions to cause applying of a bias during the introduction of the inert gas and generation of the plasma.

5. The apparatus of claim 4, wherein the computer-executable instructions include instructions to cause applying of the bias at a power of about 5V to about 15V.

6. The apparatus of claim 3, wherein the computer-executable instructions for causing generation of the plasma include instructions to set a low radio frequency plasma power to about 30 W to about 500 W.

7. The apparatus of claim 1, wherein the computer-executable instructions for causing introduction of the hard mask deposition precursor include instructions for causing introduction of methane.

8. The apparatus of claim 1, wherein the computer-executable instructions further comprises instructions for causing providing of a substrate having a patterned photoresist to the chuck in one of the one or more process chambers.

9. The apparatus of claim 1, wherein the computer-executable instructions causes removal of about 5 nm to about 10 nm of material after one cycle of introducing the modification gas and introducing the inert gas and generating the plasma.

10. The apparatus of claim 1, wherein the chuck is set to a temperature between about 0° C. and about 120° C.

11. The apparatus of claim 1, wherein the one or more process chambers is set to a chamber pressure between about 5 mTorr and about 100 mTorr.

12. The apparatus of claim 1, wherein plasma generator is an inductively coupled plasma generator.

13. The apparatus of claim 1, wherein chuck is an electrostatic chuck.

* * * * *